US012776276B2

(12) United States Patent
Kang et al.

(10) Patent No.: US 12,776,276 B2
(45) Date of Patent: Oct. 27, 2026

(54) PIXEL AND DISPLAY DEVICE INCLUDING THE SAME

(71) Applicant: Samsung Display Co., Ltd., Yongin-si (KR)

(72) Inventors: Jang Mi Kang, Yongin-si (KR); Jun Hyun Park, Yongin-si (KR); Min Jae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 19/375,515

(22) Filed: Oct. 31, 2025

(65) Prior Publication Data

US 2026/0057837 A1 Feb. 26, 2026

Related U.S. Application Data

(63) Continuation of application No. 18/785,980, filed on Jul. 26, 2024, now Pat. No. 12,475,849, which is a (Continued)

(30) Foreign Application Priority Data

Nov. 17, 2021 (KR) ........................ 10-2021-0158908

(51) Int. Cl.

*G09G 3/3233* (2016.01)
*H10K 59/121* (2023.01)

(Continued)

(52) U.S. Cl.

CPC ....... *G09G 3/3233* (2013.01); *H10K 59/1213* (2023.02); *H10K 59/1216* (2023.02);

(Continued)

(58) Field of Classification Search

CPC .......... G09G 3/00; G09G 3/32; G09G 3/3208; G09G 3/3225; G09G 3/3233

See application file for complete search history.

(56) References Cited

U.S. PATENT DOCUMENTS

| | | | |
|---|---|---|---|
| 6,995,509 | B2 | 2/2006 | Yamazaki et al. |
| 9,741,287 | B2 | 8/2017 | Na et al. |

(Continued)

FOREIGN PATENT DOCUMENTS

| | | |
|---|---|---|
| KR | 10-2156781 | 12/2015 |
| KR | 10-2019-0116597 | 10/2019 |

(Continued)

OTHER PUBLICATIONS

Notice of Allowance issued Feb. 13, 2023, in U.S. Appl. No. 17/886,393.

(Continued)

*Primary Examiner* — Kevin M Nguyen

(74) *Attorney, Agent, or Firm* — Sughrue Mion, PLLC

(57) ABSTRACT

A pixel of display device includes a light emitting element, a first transistor coupled between first power source and a second node and having a gate electrode connected to a first node N1, and the first transistor being configured to control a driving current supplied to the light emitting element in response to a voltage of the first node, a first capacitor including one electrode connected to the first node and another electrode connected to a third node, a second transistor coupled between the third node and a data line, a third transistor coupled between the first node and the second node, a fourth transistor coupled between the first node and an initialization power source, a fifth transistor coupled between a reference power source and the third node, and an eighth transistor coupled between a fourth node and an anode initialization power source.

20 Claims, 28 Drawing Sheets

<SSP>

Related U.S. Application Data continuation of application No. 18/201,739, filed on May 24, 2023, now Pat. No. 12,073,786, which is a continuation of application No. 17/886,393, filed on Aug. 11, 2022, now Pat. No. 11,705,066.

(51) Int. Cl.
*H10K 59/126* (2023.01)
*H10K 59/131* (2023.01)

(52) U.S. Cl.
CPC ......... *H10K 59/126* (2023.02); *H10K 59/131* (2023.02); *G09G 2300/0413* (2013.01); *G09G 2300/0819* (2013.01); *G09G 2300/0852* (2013.01); *G09G 2300/0861* (2013.01); *G09G 2310/08* (2013.01); *G09G 2320/0247* (2013.01); *G09G 2320/0257* (2013.01); *G09G 2330/021* (2013.01)

(56) References Cited

U.S. PATENT DOCUMENTS

| | | | | |
|---|---|---|---|---|
| 10,885,847 | B2 | 1/2021 | Wang et al. | |
| 11,056,049 | B2 | 7/2021 | Kim et al. | |
| 11,705,066 | B2 | 7/2023 | Kang et al. | |
| 12,073,786 | B2 * | 8/2024 | Kang .................. | G09G 3/3233 |
| 2009/0027310 | A1 | 1/2009 | Kim | |
| 2017/0178566 | A1 | 6/2017 | Xu et al. | |
| 2018/0151123 | A1 | 5/2018 | Li et al. | |
| 2020/0105849 | A1 | 4/2020 | Kim et al. | |
| 2020/0175911 | A1 | 6/2020 | Ko et al. | |
| 2020/0226978 | A1 | 7/2020 | Lin et al. | |
| 2022/0028333 | A1 | 1/2022 | Jeong et al. | |

FOREIGN PATENT DOCUMENTS

| | | | |
|---|---|---|---|
| KR | 10-2020-0037027 | | 4/2020 |
| KR | 10-2020-0133118 | A1 | 11/2020 |
| KR | 10-2021-0013509 | | 2/2021 |

OTHER PUBLICATIONS

Communication dated Jan. 27, 2026, issued by the Korean Ministry of Intellectual Property in Korean Patent Application No. 10-2021-0158908.

* cited by examiner

T2: T2_1, T2_2
T3: T3_1, T3_2
T4: T4_1, T4_2
T5: T5_1, T5_2

<DSP>

<DSP>

<DSP>

<DSP>

<DSP>

<DSP>

<SSP>

<SSP>

<SSP>

<SSP>

GAT1: C1_E1, C2_E1, T2_GE, T3_GE, T4_GE, T5_GE, T6_GE, T7_GE, T8_GE, T9_GE
GAT2: SHP1, SHP2, SHP3, VL_VDD, C1_E2
SD1: SL1~SL4, EL1, EL2, VL_REF, VL_int, VL_aint, VL_bs, BRP1~BRP5
SD2: DL, VDDL, VREFL, BRP6

ACT: ACT1, ACT2
ACT1: ACT_DM1, ACT_ST1
ACT2: ACT_DM2, ACT_ST2, ACT_BR1, ACT_BR2

T2: T2_1, T2_2
T3: T3_1, T3_2
T4: T4_1, T4_2
T5: T5_1, T5_2

BRP3: BRP3_1, BRP3_2, BRP3_3

PIXEL AND DISPLAY DEVICE INCLUDING THE SAME

CROSS REFERENCE TO RELATED APPLICATION

This is a Continuation of U.S. application Ser. No. 18/785,980 filed Jul. 26, 2024, which is a continuation application of U.S. patent application Ser. No. 18/201,739 filed May 24, 2023 now U.S. Pat. No. 12,073,786, issued on Aug. 7, 2024, the disclosure of which is incorporated herein by reference in its entirety. U.S. patent application Ser. No. 18/201,739 is a continuation application of U.S. patent application Ser. No. 17/886,393 filed Aug. 11, 2022, now U.S. Pat. No. 11,705,066, issued Jul. 18, 2023, the disclosure of which is incorporated herein by reference in its entirety. U.S. patent application Ser. No. 17/886,393 claims priority to and benefits of Korean Patent Application No. 10-2021-0158908 under 35 U.S.C. § 119, filed Nov. 17, 2021 in the Korean Intellectual Property Office, the entire contents of which are incorporated herein by reference.

BACKGROUND

Field

Embodiments of the invention relate generally to a display device, and more specifically, a pixel capable of being driven at various driving frequencies and a display device including the same.

Discussion of the Background

With development of information technology, the importance of a display device, which is a connection medium between a user and information, has been increased.

The display device includes a plurality of pixels. Each of the pixels includes a plurality of transistors, and a light emitting element and a capacitor electrically connected to the transistors. The transistors are respectively turned on in response to signals provided through a line, and thus a predetermined driving current is generated. The light emitting element emits light in response to such a driving current.

Recently, in order to improve driving efficiency and minimize power consumption of the display device, a method of driving the display device at a low frequency is used.

The above information disclosed in this Background section is only for understanding of the background of the inventive concepts, and, therefore, it may contain information that does not constitute prior art.

SUMMARY

Applicant recognized that the need for a pixel structure and a method of driving the pixels in a display device that is capable of improving display quality when a user requests driving the display device at a low frequency. For example, in a low-frequency driving mode in which a length of one frame period is increased, the hysteresis difference due to a grayscale difference between adjacent pixels may be severe. Therefore, the difference of threshold voltage shift amounts of driving transistors of adjacent pixels may occur, and thus a screen drag (a ghost phenomenon) may be recognized by a user.

Pixels constructed according to the principles and illustrative embodiments of the invention are capable of being driven at various driving frequencies.

Further, display devices including the pixels constructed according to the principles and illustrative embodiments of the invention are capable of more effectively improving the hysteresis characteristics (difference in a threshold voltage shift) by applying a bias with a substantially constant voltage to a source electrode of a driving transistor to match the driving current direction and bias direction, thereby reducing or preventing a light emitting element from unintentionally emitting light when a driving transistor is initialized by separately supplying each of an initialization voltage of a gate electrode of the driving transistor and an initialization voltage of an anode of the light emitting element. Thus, screen drag due to the hysteresis deviation may be reduced or removed.

Additional features of the inventive concepts will be set forth in the description which follows, and in part will be apparent from the description, or may be learned by practice of the inventive concepts.

According to one aspect of the invention, a pixel of a display device includes a light emitting element, a first transistor coupled between a first power source and a second node and having a gate electrode connected to a first node, and the first transistor being configured to control a driving current supplied to the light emitting element in response to a voltage of the first node, a first capacitor including one electrode connected to the first node and another electrode connected to a third node, a second transistor coupled between the third node and a data line, a third transistor coupled between the first node and the second node, a fourth transistor coupled between the first node and an initialization power source, a fifth transistor coupled between a reference power source and the third node, and an eighth transistor coupled between a fourth node and an anode initialization power source.

The pixel may further include a sixth transistor coupled between the first power source and a fifth node connected to one electrode of the first transistor, and a seventh transistor coupled between the second node and the fourth node.

The pixel may further include a ninth transistor coupled between the fifth node and bias power source.

The pixel may further include a second capacitor including one electrode connected to the first power source and another electrode connected to the third node.

The first power source and one electrode of the sixth transistor may be connected by a bridge pattern, and the pixel may further include a (2_1)-th capacitor including one electrode connected to the bridge pattern and another electrode connected to the other electrode of the first capacitor.

The first capacitor may have a capacitance equal to a sum of a capacitance of the second capacitor and a capacitance of the (2_1)-th capacitor.

The second transistor may include a (2_1)-th transistor and a (2_2)-th transistor connected in series, and include a first shielding pattern overlapping a node between the (2_1)-th transistor and the (2_2)-th transistor, and the first shielding pattern may be connected to the anode initialization power source.

The third transistor may include a (3_1)-th transistor and a (3_2)-th transistor connected in series, and include a second shielding pattern overlapping a node between the (3_1)-th transistor and the (3_2)-th transistor, and the third shielding pattern may be connected to the first power source.

The fourth transistor may include a (4_1)-th transistor and a (4_2)-th transistor connected in series, and include a third shielding pattern overlapping a node between the (4_1)-th transistor and the (4_2)-th transistor, and the third shielding pattern may be connected to the first power source.

The fifth transistor may include a (5_1)-th transistor and a (5_2)-th transistor connected in series, and include a third shielding pattern overlapping a node between the (5_1)-th transistor and the (5_2)-th transistor, and the second shielding pattern may be connected to the anode initialization power source.

The pixel may further include at least one power supply to supply one or more of the first power source, the initialization power source, the reference power source, and the anode initialization power source.

According to another aspect of the invention, a display device includes a substrate, a semiconductor layer disposed on the substrate and forming a channel region of a plurality of transistors, a first conductive layer disposed on the semiconductor layer and forming a gate electrode of the transistors and one electrode of capacitors; and a second conductive layer disposed on the first conductive layer and forming another electrodes of the capacitors and a plurality of shielding patterns. The plurality of transistors includes a first transistor coupled between first power source and a second node and having a gate electrode connected to a first node, and the first transistor being configured to control a driving current supplied to a light emitting element in response to a voltage of the first node, a second transistor coupled between a third node and a data line, a third transistor coupled between the first node and the second node, a fourth transistor coupled between the first node and an initialization power source, a fifth transistor coupled between a reference power source and the third node, and an eighth transistor coupled between a fourth node and an anode initialization power source.

The semiconductor layer may include a first semiconductor pattern having a first dummy portion extending in a first direction and connected to the reference power source, and a second semiconductor pattern having a second dummy portion separated from the first dummy portion, extending in the first direction and connected to the anode initialization power source.

The first semiconductor pattern may further include a first stem portion integrally formed with the first dummy pattern, the first stem portion including a second sub-semiconductor pattern forming a channel of the second transistor, and a fifth sub-semiconductor pattern forming a channel of the fifth transistor.

The first dummy portion, the first stem portion, the second sub-semiconductor pattern, and the fifth sub-semiconductor pattern may be integrally formed.

Each of the second sub-semiconductor pattern and the fifth sub-semiconductor pattern may include a bent portion for forming a dual gate, and a first distance of the bent portion of the second sub-semiconductor pattern in the first direction may be greater than a second distance of the bent portion of the fifth sub-semiconductor pattern in the first direction.

The bent portion of the fifth sub-semiconductor pattern may further include an expansion portion protruding in the first direction on one side of the bent portion.

The shielding patterns may include a first shielding pattern overlapping the second sub-semiconductor pattern in a third direction, and a second shielding pattern overlapping the fifth sub-semiconductor pattern in the third direction.

The plurality of transistors may include a sixth transistor coupled between the first power source and a fifth node connected to one electrode of the first transistor, and a seventh transistor coupled between the second node and the fourth node.

The capacitors may include a first capacitor including one electrode connected to the first node and another electrode connected to the third node, and a second capacitor including one electrode connected to the first power source and another electrode connected to the third node.

The display device may further include a third conductive layer disposed on the second conductive layer and forming a plurality of scan lines, a plurality of emission control lines, and a plurality of bridge patterns, and the first power source may be connected by one electrode of the sixth transistor and a third bridge pattern among the bridge patterns.

The third bridge pattern may include a horizontal portion extending in a first direction, and first and second vertical portions disposed at both ends of the horizontal portion and extending in a second direction crossing the first direction.

The capacitors may further include a (2_1)-th capacitor including one electrode connected to the horizontal portion and another electrode connected to the other electrode of the first capacitor.

The first vertical portion and the second vertical portion may be spaced apart from the other electrode of the first capacitor by a preset distance.

The display device may further include a fourth conductive layer disposed on the third conductive layer and having a plurality of data lines.

Each of the first vertical portion and the second vertical portion may be disposed between the data lines and the other electrode of the first capacitor.

The display device may further include at least one power supply to supply one or more of the first power source, the initialization power source, the reference power source, and the anode initialization power source.

According to yet another aspect of the invention, a pixel of a display device includes a light emitting element, a first transistor coupled between a first voltage and a second node and having a gate electrode connected to a first node, a first capacitor including one electrode connected to the first node and another electrode connected to a third node, a second transistor coupled between the third node and a data line, a third transistor coupled between the first node and the second node, a fifth transistor coupled between a second voltage and the third node, and an eighth transistor coupled between a fourth node and a third voltage.

The pixel may further include a fourth transistor coupled between the first node and a fourth voltage.

The pixel may further include a sixth transistor coupled between the first voltage and a fifth node connected to one electrode of the first transistor, and a seventh transistor coupled between the second node and the fourth node.

The pixel may further include a ninth transistor coupled between the fifth node and a fifth voltage.

The pixel may further include a second capacitor including one electrode connected to the first voltage and another electrode connected to the third node.

The second transistor may have a gate electrode connected to a first signal.

The third transistor may have a gate electrode connected to a second signal.

The fourth transistor may have a gate electrode connected to a third signal.

The fifth transistor may have a gate electrode connected to the second signal.

The sixth transistor may have a gate electrode connected to a fourth signal.

The seventh transistor may have a gate electrode connected to a fifth signal.

The eighth transistor may have a gate electrode connected to a sixth signal.

The ninth transistor may have a gate electrode connected to the sixth signal.

The first transistor may be configured to control a driving current supplied to the light emitting element in response to a voltage of the first node.

At least one of the first to ninth transistors may include an oxide semiconductor.

The pixel may further include at least one power supply to supply one or more of the first voltage, the second voltage, the third voltage and the fourth voltage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

DETAILED DESCRIPTION

Figure 1:
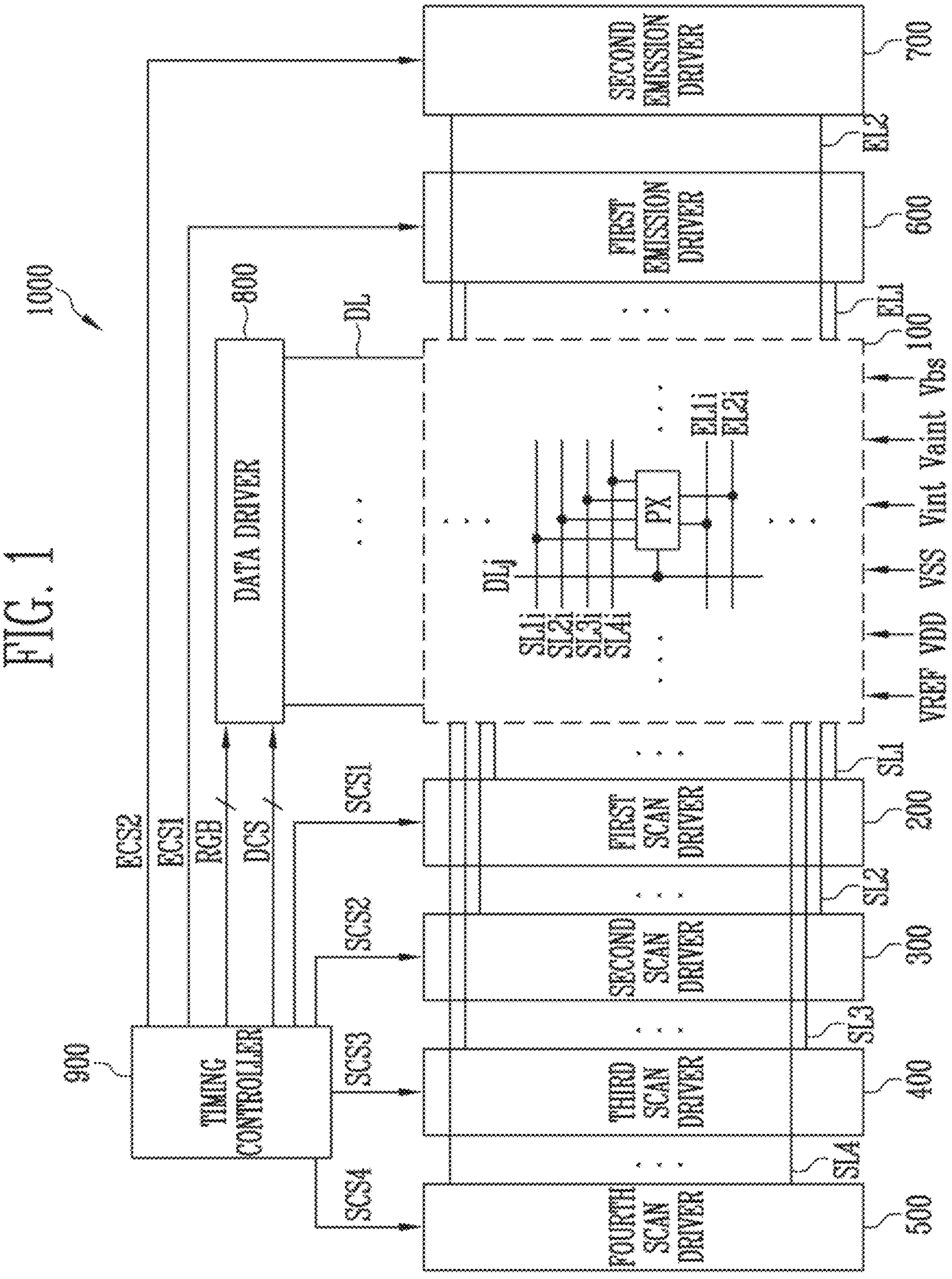
FIG. 1 is a block diagram of an embodiment of a display device constructed according to the principles of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element such as transistor discussed below could be termed a second element without departing from the teachings of the disclosure, and the claims are not necessarily limited to the number of the element used in the specification.

Spatially relative terms, such as “beneath,” “below,” “under,” “lower,” “above,” “upper,” “over,” “higher,” “side” (e.g., as in “sidewall”), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as “below” or “beneath” other elements or features would then be oriented “above” the other elements or features. Thus, the exemplary term “below” can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, “a,” “an,” and “the” are intended to include the plural forms as well, unless the context clearly indicates otherwise. Moreover, the terms “comprises,” “comprising,” “includes,” and/or “including,” when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms “substantially,” “about,” and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an embodiment of a display device constructed according to the principles to the invention.

Referring to FIG. 1, the display device 1000 may include a display panel 100, scan drivers 200, 300, 400, and 500, emission drivers 600 and 700, a data driver 800, and a timing controller 900.

The scan drivers 200, 300, 400, and 500 have been divided into a first scan driver 200, a second scan driver 300, a third scan driver 400, and a fourth scan driver 500, which may be independently operable. The emission drivers 600 and 700 have been divided into a first emission driver 600 and a second emission driver 700, which may be independently operable. However, the division of the scan driver and the emission driver is for convenience of description, and at least a portion of the scan drivers and the emission drivers may be integrated into one driving circuit, module, and the like according to the particular desired design.

In an embodiment, the display device 1000 may further include a power supply, which is not shown, to supply voltages for a first power source VDD, a second power source VSS, a third power source VREF (or reference power source), a fourth power source Vint (or initialization power source), a fifth power source Vaint (or anode initialization power source), and a sixth power source Vbs (or bias power source) to the display panel 100. The power supply may supply low power and high power to define a gate-on level and a gate-off level of a scan signal, a control signal, and/or an emission control signal to the scan drivers 200, 300, 400, and 500 and/or to the emission drivers 600 and 700. The low power source may have a voltage level lower than that of the high power source. However, this is an example, and at least one of the first power source VDD, the second power source VSS, the third power source VREF (or the reference power source), the fourth power source Vint (or the initialization power source), the fifth power source Vaint (or the anode initialization power source), the sixth power source Vbs (or the bias power source), the low power source, and the high power source may be supplied from the timing controller 900 or the data driver 800.

The first power source VDD and the second power source VSS may generate voltages for driving a light emitting element. In an embodiment, the voltage level of the second power source VSS may be lower than a voltage level of the first power source VDD. For example, the voltage of the first power source VDD may be a positive voltage, and the voltage of the second power source VSS may be a negative voltage.

The reference power source VREF may be a power source for initializing a pixel PX. For example, a capacitor and/or a transistor included in the pixel PX may be initialized by the voltage of the reference power source VREF. The reference power source VREF may be a positive voltage.

The initialization power source Vint may be a power source for initializing the pixel PX. For example, a driving transistor included in the pixel PX may be initialized by the voltage of the initialization power source Vint. The initialization power source Vint may be a negative voltage.

The anode initialization power source Vaint may be a power source for initializing the pixel PX. For example, an anode of the light emitting element included in the pixel PX may be initialized by the voltage of the anode initialization power source Vaint. The anode initialization power source Vaint may be a negative voltage.

The bias power source Vbs may be a power source for supplying a predetermined on-bias voltage to a source electrode of the driving transistor included in the pixel PX. The bias power source Vbs may be a positive voltage. In an embodiment, the voltage of the bias power source Vbs may be a level similar to a data voltage of a black grayscale. For example, the voltage of the bias power source Vbs may be about 5 to 7V.

The display device 1000 may display an image at various image refresh rates (drive frequencies, or screen refresh rates) according to the particular driving condition. The image refresh rate is a frequency at which a data signal is substantially written to the driving transistor of the pixel PX. For example, the image refresh rate is also referred to as a screen scan rate or a screen refresh frequency, and indicates the frequency at which a display screen is refreshed for one second.

In an embodiment, an output frequency of the data driver 800 for one horizontal line (or pixel row) and/or an output frequency of the first scan driver 200 outputting a write scan signal may be determined in response to the image refresh rate. For example, a refresh rate for driving a moving image may be a frequency of about 60 Hz or more (for example, 120 Hz).

In an embodiment, the display device 1000 may adjust an output frequency of the scan drivers 200, 300, 400, and 500 for one horizontal line (or pixel row) and an output frequency of the data driver 800 corresponding thereto according to the particular driving condition. For example, the display device 1000 may display an image in response to various image refresh rates ranging from 1 Hz to 120 Hz. However, this is an example, and the display device 1000 may display an image also at an image refresh rate of 120 Hz or higher (for example, 240 Hz or 480 Hz).

The display panel 100 may include pixels PX respectively connected to data lines DL, scan lines SL1, SL2, SL3, and SL4, and emission control lines EL1 and EL2. The pixels PX may receive the voltages of the first power source VDD, the second power source VSS, the initialization power source Vint, and the reference power source VREF from one or more power sources disposed outside the panel. In an embodiment, a pixel PX disposed in an i-th row and a j-th column (where i and j are natural numbers) may be connected to scan lines SL1*i*, SL2*i*, SL3*i*, and SL4*i* corresponding to an i-th pixel row, emission control lines E1*i* and EL2*i* corresponding to the i-th pixel row, and a data line DLj corresponding to a j-th pixel column.

In an embodiment, the signal lines SL1, SL2, SL3, SL4, EL1, EL2, and DL connected to the pixel PX may be variously set in response to the circuit structure of the pixel PX.

The timing controller 900 may generate a first driving control signal SCS1, a second driving control signal SCS2, a third driving control signal SCS3, a fourth driving control signal SCS4, a fifth driving control signal ECS1, a sixth driving control signal ECS2, and a seventh driving control signal DCS in response to synchronization signals supplied from outside of the panel. The first driving control signal SCS1 may be supplied to the first scan driver 200, the second driving control signal SCS2 may be supplied to the second scan driver 300, the third driving control signal SCS3 may be supplied to the third scan driver 400, the fourth driving control signal SCS4 may be supplied to the fourth scan driver 500, the fifth driving control signal ECS1 may be supplied to the first emission driver 600, the sixth driving control signal ECS2 may be supplied to the second emission driver 700, and the seventh driving control signal DCS may be supplied to the data driver 800. In addition, the timing controller 900 may rearrange input image data supplied from outside of the panel into image data RGB and supply the image data RGB to the data driver 800.

The first driving control signal SCS1 may include a first scan start pulse and clock signals. The first scan start pulse may control a first timing of a scan signal output from the first scan driver 200. The clock signals may be used to shift the first scan start pulse.

The second driving control signal SCS2 may include a second scan start pulse and clock signals. The second scan start pulse may control a first timing of a scan signal output from the second scan driver 300. The clock signals may be used to shift the second scan start pulse.

The third driving control signal SCS3 may include a third scan start pulse and clock signals. The third scan start pulse may control a first timing of a scan signal output from the third scan driver 400. The clock signals may be used to shift the third scan start pulse.

The fourth driving control signal SCS4 may include a fourth scan start pulse and clock signals. The fourth scan start pulse may control a first timing of a scan signal output from the fourth scan driver 500. The clock signals may be used to shift the fourth scan start pulse.

The fifth driving control signal ECS1 may include a first emission control start pulse and clock signals. The first emission control start pulse may control a first timing of an emission control signal output from the first emission driver 600. The clock signals may be used to shift the first emission control start pulse.

The sixth driving control signal ECS2 may include a second emission control start pulse and clock signals. The second emission control start pulse may control a first timing of an emission control signal output from the second emission driver 700. The clock signals may be used to shift the second emission control start pulse.

The seventh driving control signal DCS may include a source start pulse and clock signals. The source start pulse may control a sampling start time point of data. The clock signals may be used to control a sampling operation.

The first scan driver 200 may receive the first driving control signal SCS1 from the timing controller 900, and supply the scan signal (for example, a first scan signal) to first scan lines SL1 based on the first driving control signal SCS1. For example, the first scan driver 200 may sequentially supply the first scan signal to the first scan lines SL1. When the first scan signal is sequentially supplied, the pixels PX may be selected in a horizontal line unit (or a pixel row unit), and a data signal may be supplied to the pixels PX. That is, the first scan signal may be a signal used for data writing.

The first scan signal may be set to a gate-on level (for example, a low voltage). A transistor included in the pixel PX and receiving the first scan signal may be set to a turn-on state when the first scan signal is supplied.

In an embodiment, in response to one scan line (for example, the first scan line SL1*i*) among the first scan lines SL1, the first scan driver 200 may supply the scan signal (for example, the first scan signal) to the first scan line SL1*i* at the same frequency (for example, a second frequency) as the image refresh rate of the display device 1000. The second frequency may be set as a portion of a first frequency for driving the emission drivers 600 and 700.

The first scan driver 200 may supply the scan signal to the first scan lines SL1 in a display scan period of one frame. For example, the first scan driver 200 may supply at least one scan signal to each of the first scan lines SL1 during the display scan period.

The second scan driver 300 may receive the second driving control signal SCS2 from the timing controller 800, and supply the scan signal (for example, a second scan signal) to second scan lines SL2 based on the second driving control signal SCS2. For example, the second scan driver 300 may sequentially supply the second scan signal to the second scan lines SL2. The second scan signal may be supplied to initialize the transistor and the capacitor included in the pixels PX and/or compensate for a threshold voltage (Vth). When the second scan signal is supplied, the pixels PX may perform threshold voltage compensation and/or initialization operations. The second scan signal may be set to a gate-on level (for example, a low voltage). A transistor included in the pixel PX and receiving the second scan signal may be set to a turn-on state when the second scan signal is supplied.

In an embodiment, in response to one scan line (for example, the second scan line SL2*i*) among the second scan lines SL2, the second scan driver 300 may supply the scan signal (for example, the second scan signal) to the second scan line SL2*i* at the same frequency (for example, the second frequency) as an output of the first scan driver 200.

The second scan driver 300 may supply the scan signal to the second scan lines SL2 during the display scan period of one frame. For example, the second scan driver 300 may supply at least one scan signal to each of the second scan lines SL2 during the display scan period.

The third scan driver 400 may receive the third driving control signal SCS3 from the timing controller 900, and supply a scan signal (for example, a third scan signal) to third scan lines SL3 based on the third driving control signal SCS3. For example, the third scan driver 400 may sequentially supply the third scan signal to the third scan lines SL3. The third scan signal may be supplied for initialization of the driving transistor included in the pixels PX and/or initialization the capacitor included in the pixels PX. When the third scan signal is supplied, the pixels PX may perform an initialization operation of the driving transistor and/or an initialization operation of the capacitor.

The third scan signal may be set to a gate-on level (for example, a low voltage). A transistor included in the pixel PX and receiving the third scan signal may be set to a turn-on state when the third scan signal is supplied.

In an embodiment, in response to one scan line (for example, the third scan line SL3*i*) among the third scan lines SL3, the third scan driver 400 may supply the scan signal (for example, the third scan signal) to the third scan line SL3*i* at the same frequency (for example, the second frequency) as the output of the first scan driver 200.

The fourth scan driver 500 may receive the fourth driving control signal SCS4 from the timing controller 900, and supply the scan signal (for example, a fourth scan signal) to the fourth scan lines SL4 based on the fourth driving control signal SCS4. For example, the fourth scan driver 500 may sequentially supply the fourth scan signal to the fourth scan lines SL4. The fourth scan signal may be supplied to initialize the light emitting element included in the pixels PX and supply a predetermined bias voltage (for example, an on-bias voltage) to a source electrode of the driving transistor included in the pixels PX. When the fourth scan signal is supplied, the pixels PX may initialize the light emitting element and supply the bias voltage.

The fourth scan signal may be set to a gate-on level (for example, a low voltage). A transistor included in the pixel PX and receiving the fourth scan signal may be set to a turn-on state when the fourth scan signal is supplied.

In an embodiment, in response to one scan line (for example, the fourth scan line SL4*i*) among the fourth scan lines SL4, the scan driver 500 may supply a scan signal (for example, a fourth scan signal) at the first frequency. Therefore, within one frame period, the scan signal supplied to each of the fourth scan lines SL4 may be repeatedly supplied every predetermined period.

Accordingly, when the image refresh rate is reduced, the number of repetitions of an operation of supplying the fourth scan signal within one frame period may be increased.

The first emission driver 600 may receive the fifth driving control signal ECS1 from the timing controller 900, and supply the emission control signal (for example, a first emission control signal) to the first emission control lines EL1 based on the fifth driving control signal ECS1. For example, the first emission driver 600 may sequentially supply the first emission control signal to the first emission control lines EL1.

The second emission driver 700 may receive the sixth driving control signal ECS2 from the timing controller 900, and supply the emission control signal (for example, a second emission control signal) to the second emission control lines EL2 based on the sixth driving control signal ECS2. For example, the second emission driver 700 may sequentially supply the second emission control signal to the second emission control lines EL2.

When the first emission control signal and/or the second emission control signal are/is supplied, the pixels PX may not emit light in the horizontal line unit (or the pixel row unit). To this end, the first emission control signal and the second emission control signal may be set to a gate-off level (for example, a high voltage) so that the transistors included in the pixels PX are turned off. The transistor included in the pixel PX and receiving the first emission control signal and/or the second emission control signal may be turned off when the first emission control signal and/or the second emission control signal are/is supplied, and may be turned on in other cases.

The first emission control signal and the second emission control signal may be used to control an emission time of the pixels PX. To this end, the first emission control signal and the second emission control signal may be set to have a width wider than that of the scan signal.

In an embodiment, the first emission control signal and/or the second emission control signal may have a plurality of gate-off level (for example, high voltage) periods during one frame period. For example, the first emission control signal and/or the second emission control signal may include a plurality of gate-on periods and a plurality of gate-off periods for initialization, threshold voltage compensation, and the like.

In an embodiment, similarly to the fourth scan driver 500, in response to one emission control line (for example, a first emission control line EL1*i*) among the first emission control lines EL1 and one emission control line (for example, a second emission control line EL2*i*) among the second emission control lines EL2, the first and second emission drivers 600 and 700 may supply an emission control signal (for example, first and second emission control signals) to the first and second emission control lines EL1*i* and EL2*i* at the first frequency. Therefore, within one frame period, the emission control signals respectively supplied to the first and second emission control lines EL1 and EL2 may be repeatedly supplied every predetermined period.

Accordingly, when the image refresh rate is reduced, the number of repetitions of an operation of supplying the first and emission control signals within one frame period may be increased.

The data driver 800 may receive the seventh driving control signal DCS and the image data RGB from the timing controller 900. The data driver 800 may supply the data signal to the data lines DL in response to the seventh driving control signal DCS. The data signal supplied to the data lines DL may be supplied to the pixels PX selected by the scan signal (for example, the first scan signal). To this end, the data driver 800 may supply the data signal to the data lines DL to be synchronized with the scan signal.

In an embodiment, the data driver 800 may supply the data signal to the data lines DL during one frame period in response to the image refresh rate. For example, the data driver 800 may supply the data signal to be synchronized with the scan signal supplied to the first scan lines SL1.

Figure 2A:
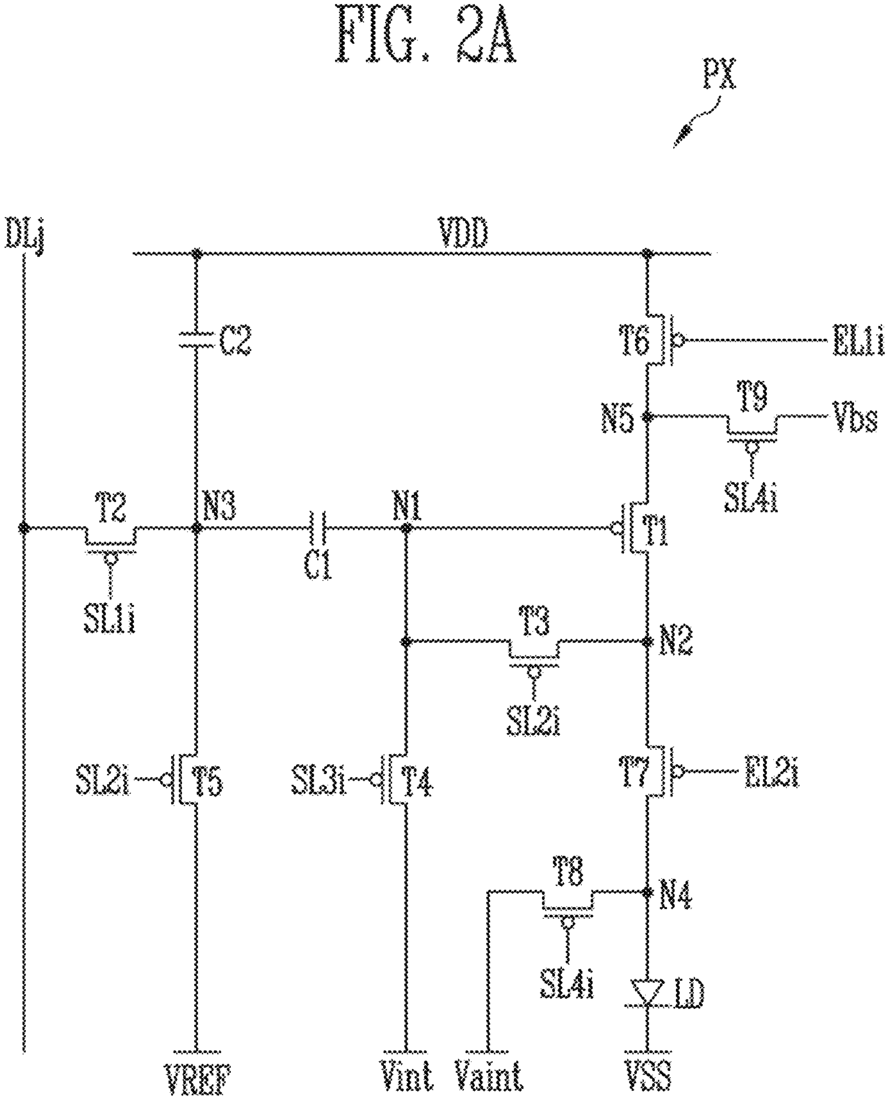
FIGS. 2A and 2B are equivalent circuit diagrams of embodiments of a representative pixel of the display device of FIG. 1
Figure 2B:
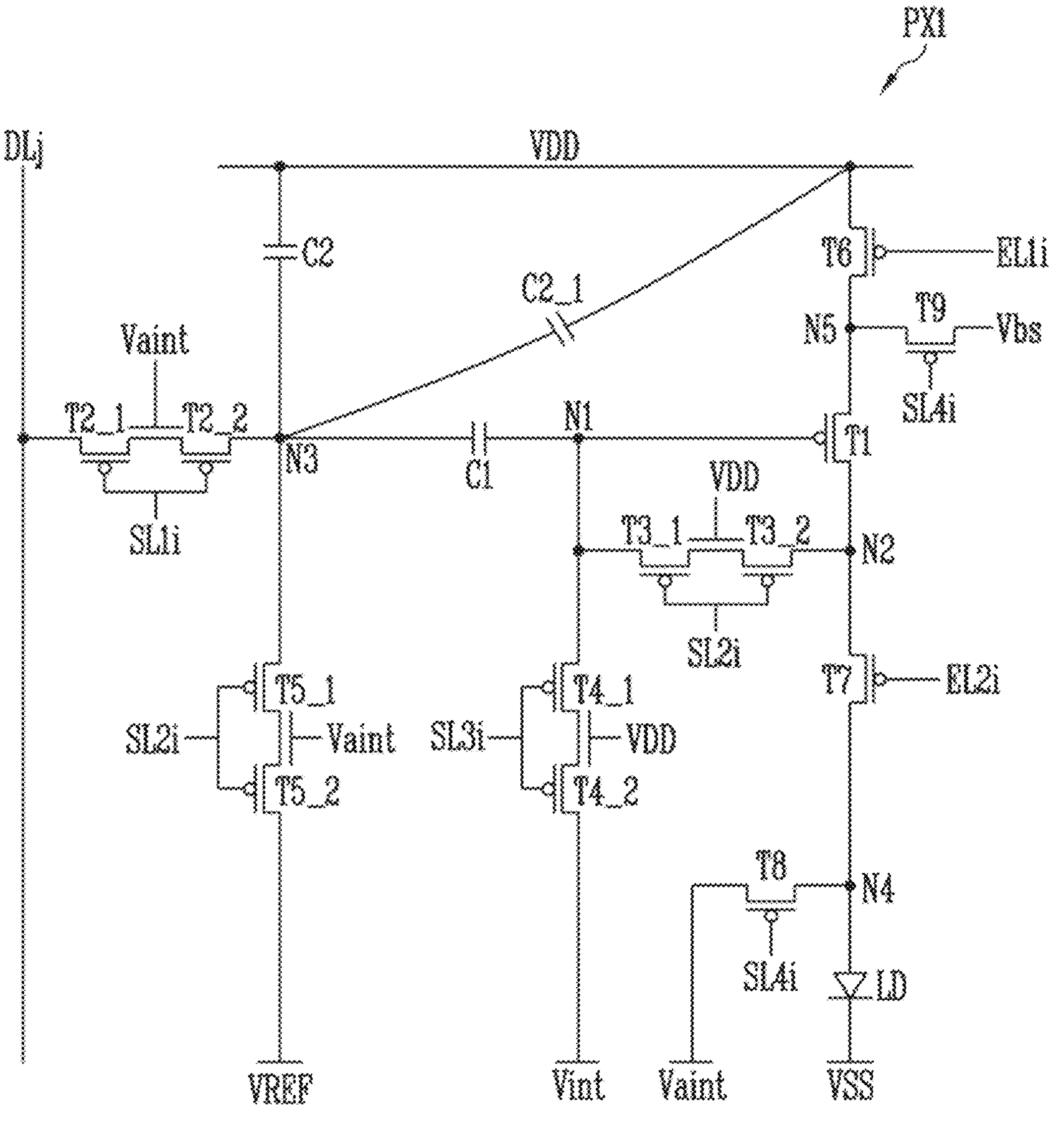

FIGS. 2A and 2B are equivalent circuit diagrams of embodiments of a representative pixel of the display device of FIG. 1 In FIGS. 2A and 2B, the pixel PX positioned in an i-th horizontal line (or the i-th pixel row) and connected to the j-th data line DLj is shown for convenience of description.

Referring to FIG. 2A, the pixel PX may include a light emitting element LD, first to ninth transistors T1 to T9, a first capacitor C1, and a second capacitor C2.

A first electrode of the light emitting element LD may be connected to a second electrode (for example, a drain electrode) of the first transistor T1 (or a second node N2) via the sixth transistor T6, and a second electrode of the light emitting element LD may be connected to the second power source VSS. Specifically, the first electrode of the light emitting element LD may be electrically connected to the second electrode of the first transistor T1 via a fourth node N4 to which one electrode of the sixth transistor T6 and one electrode of the seventh transistor T7 are commonly connected.

The first transistor T1 may be connected to the first power source VDD via the ninth transistor T9, and may be connected to the first electrode of the light emitting element LD via the sixth transistor T6. The first transistor T1 may generate a driving current and provide the driving current to the light emitting element LD. A gate electrode of the first transistor T1 may be connected to the first node N1. The first transistor T1 may function as the driving transistor of the pixel PX. The first transistor T1 may control an amount of current flowing from the first power source VDD to the second power source VSS via the light emitting element LD in response to a voltage applied to the first node N1.

The first capacitor C1 may be connected between the first node N1 and a third node N3 corresponding to the gate electrode of the first transistor T1. The first capacitor C1 may store a voltage corresponding to a voltage difference between the first node N1 and the third node N3.

The second capacitor C2 may be connected between the first power source VDD and the third node N3. The second capacitor C2 may store a voltage corresponding to a voltage difference between the first power source VDD and the third node N3. As one electrode of the second capacitor C2 is connected to the first power source VDD, which is a substantially constant voltage source, and another electrode is connected to the third node N3, the second capacitor C2 may maintain a data signal (or a data voltage) written to the third node N3 through the second transistor T2 in the display scan period during a self-scan period in which the data signal is not written. That is, the second capacitor C2 may stabilize the voltage of the third node N3.

The second transistor T2 may be connected between the data line DLj and the third node N3. The second transistor T2 may include a gate electrode receiving the scan signal. For example, the gate electrode of the second transistor T2 may be connected to the first scan line SL1*i* to receive the first scan signal. The second transistor T2 may be turned on when the first scan signal is supplied to the first scan line SL1*i*, to electrically connect the data line DLj and the third node N3. Accordingly, the data signal (or the data voltage) may be transferred to the third node N3.

The third transistor T3 may be connected to the first node N1 corresponding to the gate electrode of the first transistor T1 and the second node N2 (or a second electrode or a drain electrode of the first transistor T1). The third transistor T3 may include a gate electrode receiving the scan signal. For example, the gate electrode of the third transistor T3 may be connected to the second scan line SL2*i* to receive the second scan signal. The third transistor T3 may be turned on when the second scan signal is supplied to the second scan line SL2*i*, to electrically connect the first node N1 and the second node N2. By the turn-on of the third transistor T3, the first transistor T1 may have a diode connection shape. When the first transistor T1 has the diode connection shape, a threshold voltage of the first transistor T1 may be compensated.

The fourth transistor T4 may be connected between the initialization power source Vint and the first node N1. The fourth transistor T4 may include a gate electrode receiving the scan signal. For example, the gate electrode of the fourth transistor T4 may be connected to the third scan line SL3*i* to receive the third scan signal. The fourth transistor T4 may be turned on when the third scan signal is supplied to the third scan line SL3*i*, to electrically connect the initialization power source Vint and the first node N1. Accordingly, the voltage of the initialization power source Vint may be supplied to the first node N1. Therefore, a voltage of the first node N1 may be initialized to the voltage of the initialization power source Vint.

The fifth transistor T5 may be connected between the reference power source VREF and the third node N3. The fifth transistor T5 may include a gate electrode receiving the scan signal. For example, the gate electrode of the fifth transistor T5 may be connected to the second scan line SL2*i* to receive the second scan signal. The fifth transistor T5 may be turned on when the second scan signal is supplied to the second scan line SL2*i*, to electrically connect the reference power source VREF and the third node N3. Accordingly, the voltage of the reference power source VREF may be supplied to the third node N3. Therefore, the voltage of the third node N3 may be initialized to the voltage of the reference power source VREF.

Since the gate electrodes of the third and fifth transistors T3 and T5 are connected to the same scan line (that is, the second scan line SL2*i*), the third and fifth transistors T3 and T5 may be turned off or turned on simultaneously.

The sixth transistor T6 may be connected between the first power source VDD and the first electrode of the first transistor T1 (or a fifth node N5). The sixth transistor T6 may include a gate electrode receiving the emission control signal. For example, the gate electrode of the sixth transistor T6 may be connected to the first emission control line EL1*i* to receive first the emission control signal. The sixth transistor T6 may be turned off when the first emission control signal is supplied to the first emission control line EL1*i*, and may be turned on in other cases. The sixth transistor T6 of the turn-on state may connect the first electrode of the first transistor T1 to the first power source VDD.

The seventh transistor T7 may be connected between the second node N2 corresponding to the second electrode of the first transistor T1 and the anode of the light emitting element LD (or a fourth node N4). The seventh transistor T7 may include a gate electrode receiving the emission control signal. For example, the gate electrode of the seventh transistor T7 may be connected to the second emission control line EL2*i* to receive the second emission control signal. The seventh transistor T7 may be turned off when the second emission control signal is supplied to the second emission control line EL2*i*, and may be turned on in other cases. The seventh transistor T7 of the turn-on state may electrically connect the second node N2 and the fourth node N4.

When both of the sixth and seventh transistors T6 and T7 are turned on, the light emitting element LD may emit light with a luminance corresponding to the voltage of the first node N1

In an embodiment, when the sixth transistor T6 is turned on and the seventh transistor T7 is turned off, threshold voltage compensation of the first transistor T1 may be performed.

The eighth transistor T8 may be connected between the light emitting element LD (or the fourth node N4) and the anode initialization power source Vaint. The eighth transistor T8 may include a gate electrode receiving the scan signal. For example, the gate electrode of the eighth transistor T8 may be connected to the fourth scan line SL4*i* to receive the fourth scan signal. The eighth transistor T8 may be turned on when the fourth scan signal is supplied to the fourth scan line SL4*i*, to electrically connect the anode initialization power source Vaint and the fourth node N4. Accordingly, the voltage of the fourth node N4 (or the anode of the light emitting element LD) may be initialized to the voltage of the anode initialization power source Vaint. When the voltage of the anode initialization power source Vaint is supplied to the anode of the light emitting element LD, the parasitic capacitance of the light emitting element LD may be discharged. As the residual voltage generating the parasitic capacitance is discharged (removed), unintentional fine emission may be reduced or prevented. Therefore, the black expression ability of the pixel PX may be improved. Thus, by separating the initialization operation of the gate electrode of the first transistor T1 (or the first node N1) and the initialization operation of the anode of the light emitting element LD (or the fourth node N4), the light emitting element LD may be prevented from unintentionally emitting light during the initialization operation of the gate electrode of the first transistor T1 (or the first node N1).

The ninth transistor T9 may be connected between the first electrode of the first transistor T1 (or a fifth node N5) and the bias power source Vbs. The ninth transistor T9 may include a gate electrode receiving the scan signal. For example, the gate electrode of the ninth transistor T9 may be connected to the fourth scan line SL4*i* to receive the fourth scan signal. The ninth transistor T9 may be turned on when the fourth scan signal is supplied to the fourth scan line SL4*i*, to electrically connect the fifth node N5 and the bias power source Vbs.

As described with reference to FIG. 1, the ninth transistor T9 may supply a high voltage to the first electrode of the first transistor T1 based on the bias power source Vbs having a positive voltage. Accordingly, the first transistor T1 may have an on-bias state.

A period in which the second transistor T2 is turned on and a period in which the third, fifth, and sixth transistors T3, T5, and T6 are turned on may not overlap. For example, when the third, fifth, and sixth transistors T3, T5, and T6 are turned on, the threshold voltage compensation of the first transistor T1 may be performed, and when the second transistor T2 is turned on, the data writing may be performed. Therefore, the threshold voltage compensation period and the data writing period may be separated from each other.

In a low-frequency driving mode in which a length of one frame period is increased, the hysteresis difference due to a grayscale difference between adjacent pixels may be severe. Therefore, the difference of threshold voltage shift amounts of driving transistors of adjacent pixels may occur, and thus a screen drag (a ghost phenomenon) may be recognized by a user.

Display devices constructed according to the principles and illustrative embodiments may periodically apply a bias with a substantially constant voltage to a source electrode of the driving transistor (for example, the first transistor T1) using the ninth transistor T9. Therefore, the hysteresis deviation due to the grayscale difference between adjacent pixels may be removed, and thus screen drag due to the hysteresis deviation may be reduced or removed.

A first pixel PX1 shown in FIG. 2B is different from the pixel PX shown in FIG. 2A in that the second transistor T2, the third transistor T3, the fourth transistor T4, and the fifth transistor T5 are formed as dual gates and the first pixel PX1 further includes a (2_1) capacitor, and the remaining configurations and driving method are substantially the same. Hereinafter, repetitive descriptions of like components or operations are omitted to avoid redundancy, and the differences are mainly described.

The second transistor T2 may include a (2_1)-th transistor T2_1 and a (2_2)-th transistor T2_2 connected in series, and a first shielding pattern (refer to SHP1 of FIGS. 6A and 6D) overlapping a node between the (2_1) transistor T2_1 and the (2_2) transistor T2_2. The first shielding pattern may be connected to the anode initialization power source Vaint.

The third transistor T3 may include a (3_1)-th transistor T3_1 and a (3_2)-th transistor T3_2 connected in series, and a second shielding pattern (refer to SHP2 of FIGS. 6A and 6D) overlapping a node between the (3_1)-th transistor T3_1 and the (3_2)-th transistor T3_2. The second shielding pattern may be connected to the anode initialization power source Vaint.

The fourth transistor T4 may include a (4_1)-th transistor T4_1 and a (4_2)-th transistor T4_2 connected in series, and a third shielding pattern (refer to SHP3 of FIGS. 6A and 6D) overlapping a node between the (4_1)-th transistor T4_1 and the (4_2)-th transistor T4_2. The third shielding pattern may be connected to the first power source VDD.

The fifth transistor T5 may include a (5_1)-th transistor T5_1 and a (5_2)-th transistor T5_2 connected in series, and a third shielding pattern (refer to SHP3 of FIGS. 6A and 6D) overlapping a node between the (5_1)-th transistor T5_1 and the (5_2)-th transistor T5_2. The third shielding pattern may be connected to the first power source VDD.

The (2_1)-th capacitor C2_1 may include one electrode connected to a bridge pattern (refer to BRP3 shown in FIG. 6A or BRP3_2 shown in FIG. 6E) connecting the first power source VDD and the sixth transistor T6, and another electrode of the first capacitor C1 (or the third node N3). According to an embodiment, the capacitance of the first capacitor C1 may be equal to a sum of a capacitance of the second capacitor C2 and a capacitance of the (2_1)-th capacitor C2_1. Accordingly, the ratio of the capacitance of the first capacitor C1 and the sum of the capacitance of the second capacitor C2 and the (2_1)-th capacitor C2_1 may be substantially constantly maintained at 1:1 regardless of the differences in manufacturing processes. This is described later in detail with reference to FIGS. 6A to 6F.

FIGS. 3A to 3F are timing diagrams of an embodiment of an operation of the pixel of FIG. 2A.

Figure 3A:
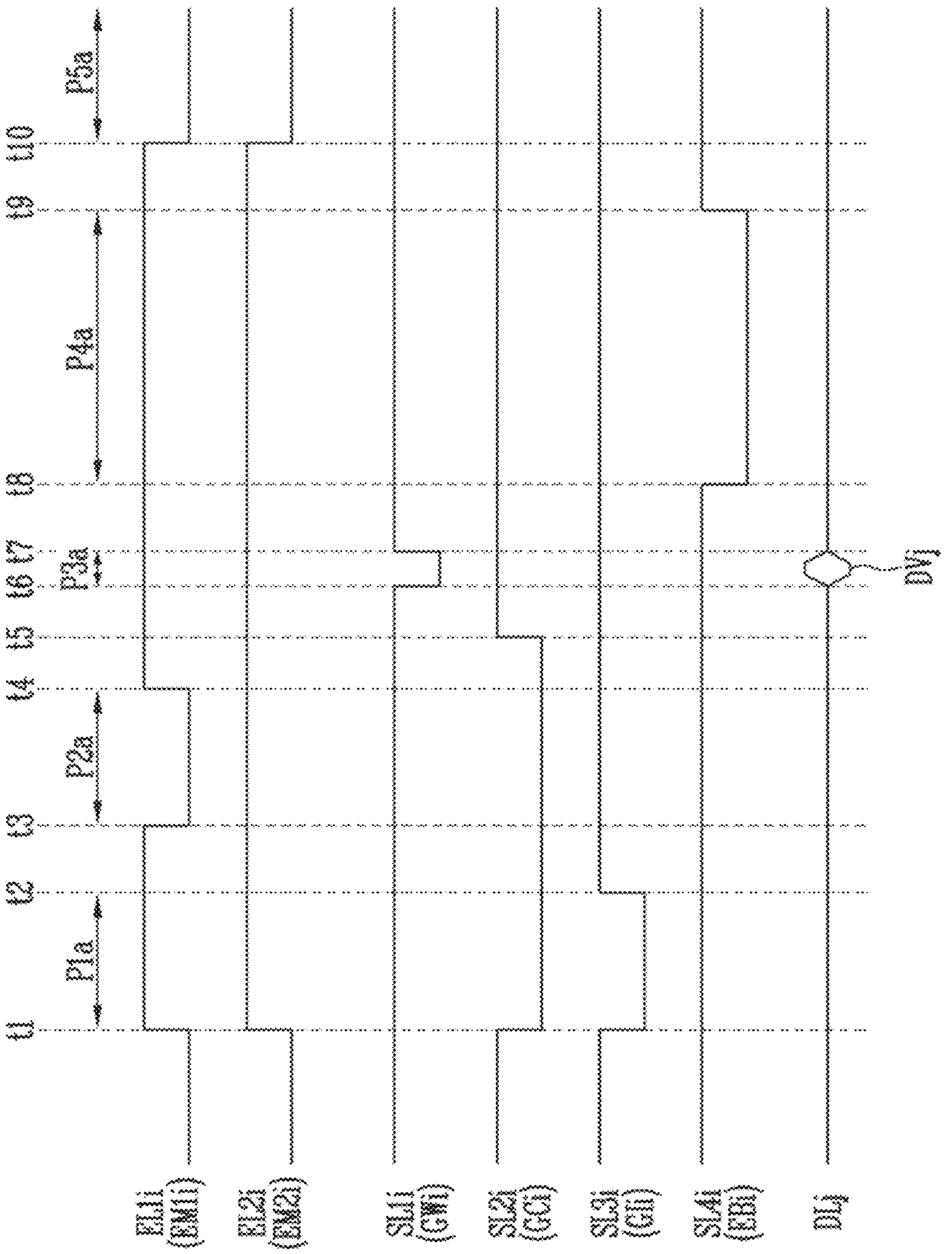
FIGS. 3A to 3F are timing diagrams of an embodiment of an operation of the pixel of FIG. 2A.

First, referring to FIGS. 2A and 3A, the pixel PX may receive signals for image display during a display scan period DSP. The display scan period DSP may include a period in which a data signal DVj actually corresponding to an output image is written.

First and second emission control signals EM1*i* and EM2*i* may be supplied to the first and second emission control lines EL1*i* and EL2*i*, respectively, and first to fourth scan signals GWi, GCi, GIi, and EBi may be supplied to the first to fourth scan lines SL1*i*, SL2*i*, SL3*i*, and SL4*i*, respectively.

At a first time point t1, the third scan signal GIi may transmit from a gate-off level to a gate-on level. Accordingly, the fourth transistor T4 may be turned on. Accordingly, the voltage of the initialization power source Vint may be supplied to the first node N1 (or the gate electrode of the first transistor T1), and the first node N1 may be initialized to the voltage of the initialization power source Vint.

In addition, the second scan signal GCi may transit from a gate-off level to a gate-on level. Accordingly, the third transistor T3 may be turned on. In addition, since the second emission control signal EM2*i* maintains a gate-off level, the seventh transistor T7 may be turned off or may maintain a turn-off state. Accordingly, the voltage of the initialization power source Vint supplied to the first node N1 may be prevented from being supplied to the fourth node N4, thereby preventing the light emitting element LD from unintentionally emitting light.

In addition, the fifth transistor T5 may be turned on by the second scan signal GCi of the gate-on level. Accordingly, the voltage of the reference power source VREF may be supplied to the third node N3, and thus the third node N3 may be initialized to the voltage of the reference power source VREF.

Figure 3B:
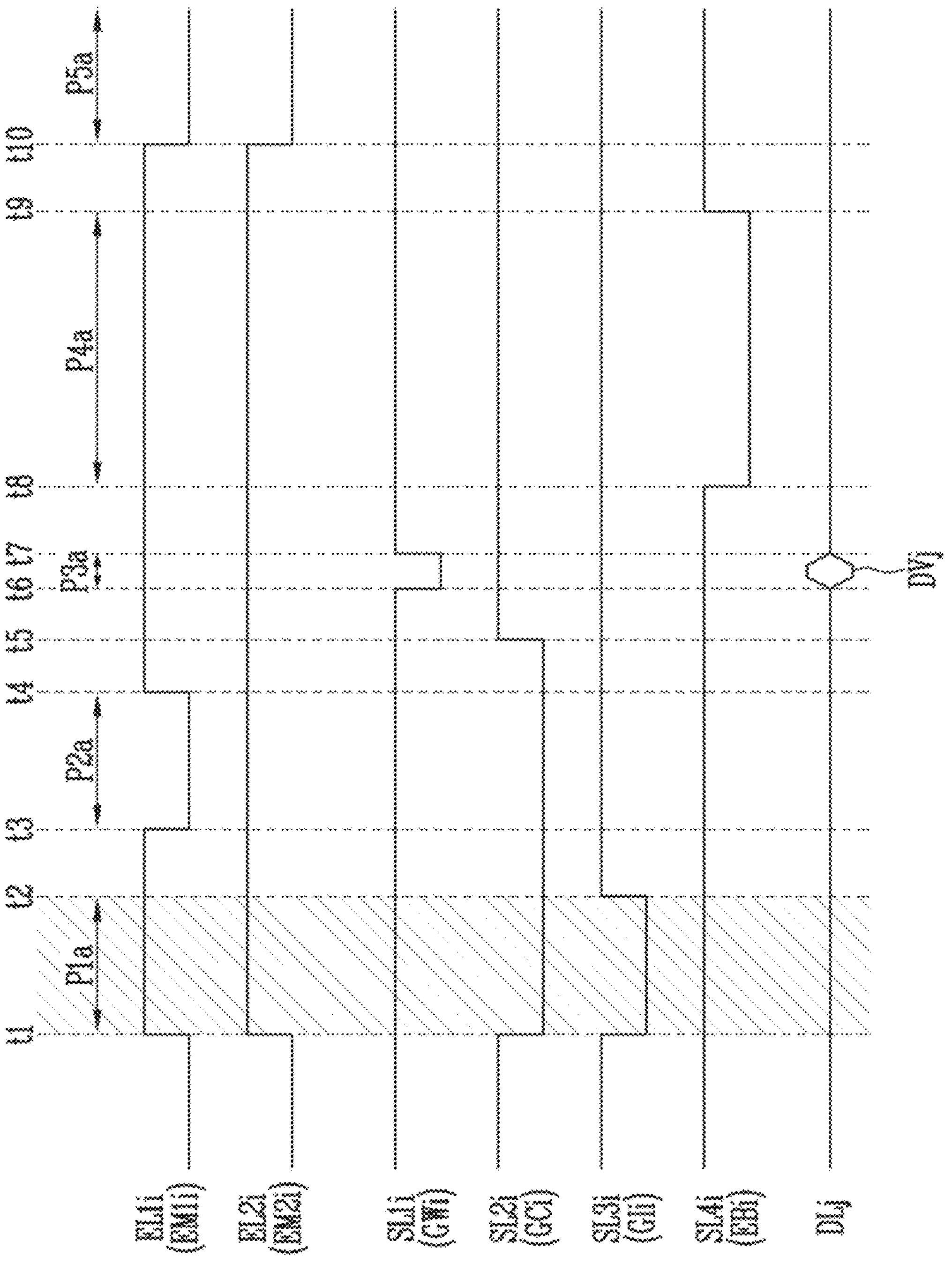

Specifically, referring to FIG. 3B, during a first period Pla from the first time point t1 to a second time point t2 shown in FIG. 3B, the voltage of the initialization power source Vint may be supplied to the first node N1 and the voltage of the reference power source VREF may be supplied to the third node N3. That is, the first period Pla may be an initialization period (or a first initialization period) for initializing the gate electrode of the driving transistor (the first transistor T1) and the third node N3.

Since the third scan signal GIi maintains the gate-on level during the period from the first time point t1 to the second time point t2, the initialization period of the gate electrode of the first transistor T1 (or the first node N1) may be performed during the corresponding period. In addition, since the second scan signal GCi maintains the gate-on level during a period from the first time point t1 to a sixth time point t6, the voltage of the reference power source VREF may be supplied to the third node N3 during the corresponding period.

At a third time point t3, the first emission control signal EM1*i* may transit from a gate-off level to a gate-on level. Accordingly, the sixth transistor T6 may be turned on, and the first electrode (for example, the source electrode) of the first transistor T1 may be connected to the first power source VDD.

In addition, since the second scan signal GCi maintains the gate-on level, the third transistor T3 may maintain the turn-on state. Accordingly, the first transistor T1 may have a diode connection shape. In this case, the voltage corresponding to the difference (or the voltage difference) between the voltage of the first power source VDD and the threshold voltage of the first transistor T1 may be sampled at the first node N1.

Figure 3C:
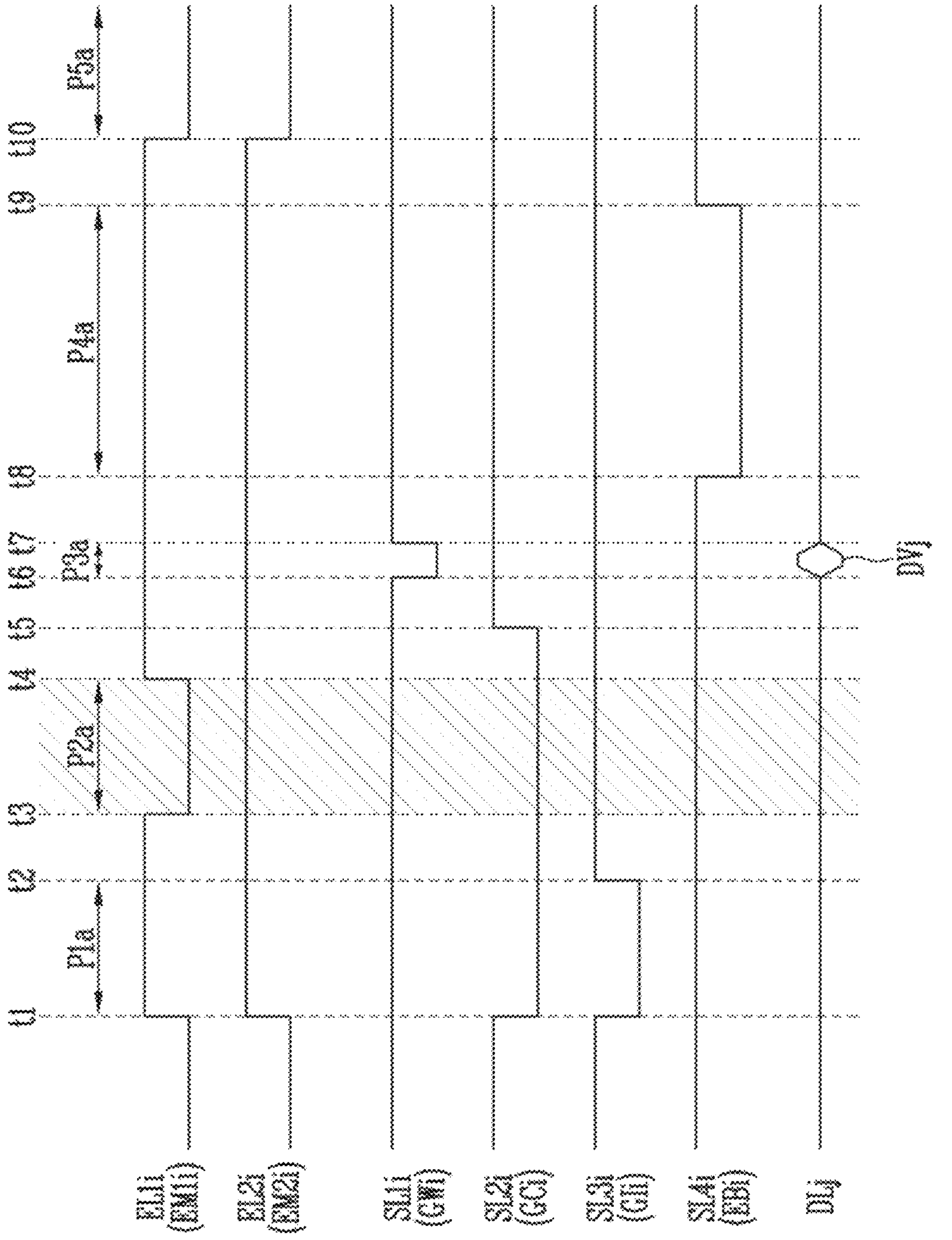

Accordingly, during a second period P2*a* from the third time point t3 to a fourth time point t4 shown in FIG. 3C, the first transistor T1 may be a diode connection shape, and thus the threshold voltage of the first transistor T1 may be compensated. That is, the second period P2*a* may be a threshold voltage compensation period.

In the second period P2*a*, the threshold voltage compensation may be performed by the voltage of the first power source VDD, which is a substantially constant voltage source. Therefore, a threshold voltage compensation operation may be performed based on a fixed voltage rather than a data signal (data voltage) that may be variable according to a pixel row and/or a frame.

At the fourth time point t4, the first emission control signal EM1*i* may transit from a gate-on level to a gate-off level. Accordingly, the sixth transistor T6 may be turned off.

At a fifth time point t5, the second scan signal GCi may transit from a gate-on level to a gate-off level. Accordingly, the third and fifth transistors T3 and T5 may be turned off.

At the sixth time point t6, the first scan signal GWi may transit from a gate-off level to a gate-on level, and thus the second transistor T2 may be turned on. Accordingly, the data signal DVj may be supplied to the third node N3.

Since the first node N1 is connected to the third node N3 by the first capacitor C1, a change amount of a voltage of the third node N3 (that is, "DATA-VREF") may be reflected to the first node N1. Therefore, the voltage of the first node N1 may change to "VDD−Vth+(DATA−VREF)". Here, DATA may be a voltage corresponding to the data signal DVj, VREF may be the voltage of the reference power source VREF, VDD may be the voltage of the first power source VDD, and Vth may be the threshold voltage of the first transistor T1.

Figure 3D:
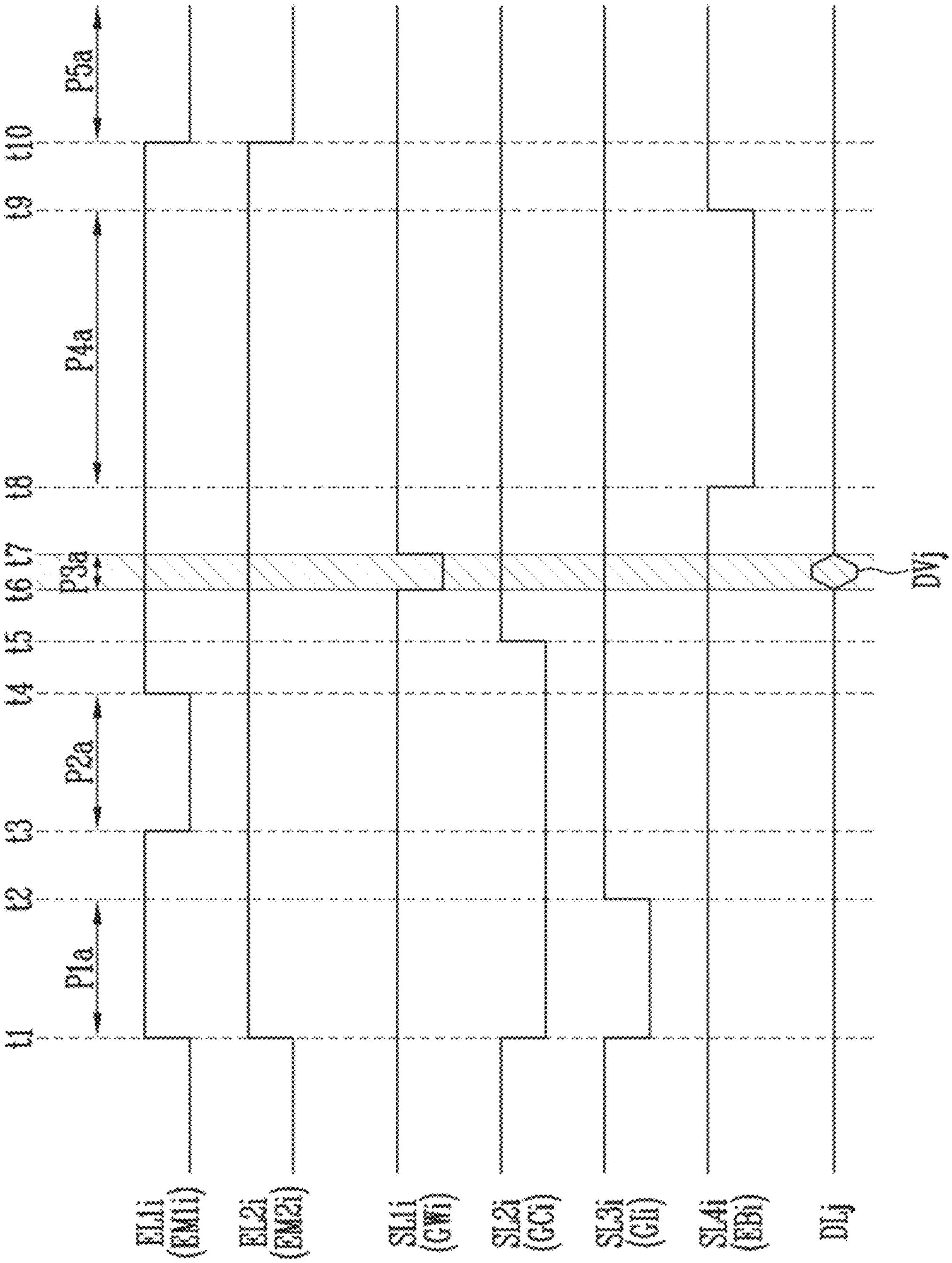

Accordingly, during a third period P3*a* from the sixth time point t6 to a seventh time point t7 shown in FIG. 3D, the data signal DVj may be written to the pixel PX. That is, the third period P3*a* may be a data writing period.

In an embodiment, the length of the third period P3*a*, that is, the length (the pulse width) of the first scan signal GWi may be one horizontal period (1H). However, the length of the first scan signal GWi is not limited thereto, and, for example, the length of the first scan signal GWi may be two or more horizontal periods 2H.

At the seventh time point t7, the first scan signal GWi may transit from a gate-on level to a gate-off level. Accordingly, the second transistor T2 may be turned off.

At an eighth time point t8, the fourth scan signal EBi may transit from a gate-off level to a gate-on level. Accordingly, the eighth transistor T8 may be turned on, and thus the voltage of the anode initialization power source Vaint may be supplied to the fourth node N4. That is, anode initialization of the light emitting element LD may be performed in a fourth period P4*a*.

In addition, the ninth transistor T9 may be turned on, and thus the voltage of the bias power source Vbs may be supplied to the fifth node N5 (or the source electrode of the first transistor T1). Therefore, the voltage of the bias power source Vbs having a positive voltage may be supplied to the first electrode (or the source electrode) of the first transistor T1.

Figure 3E:
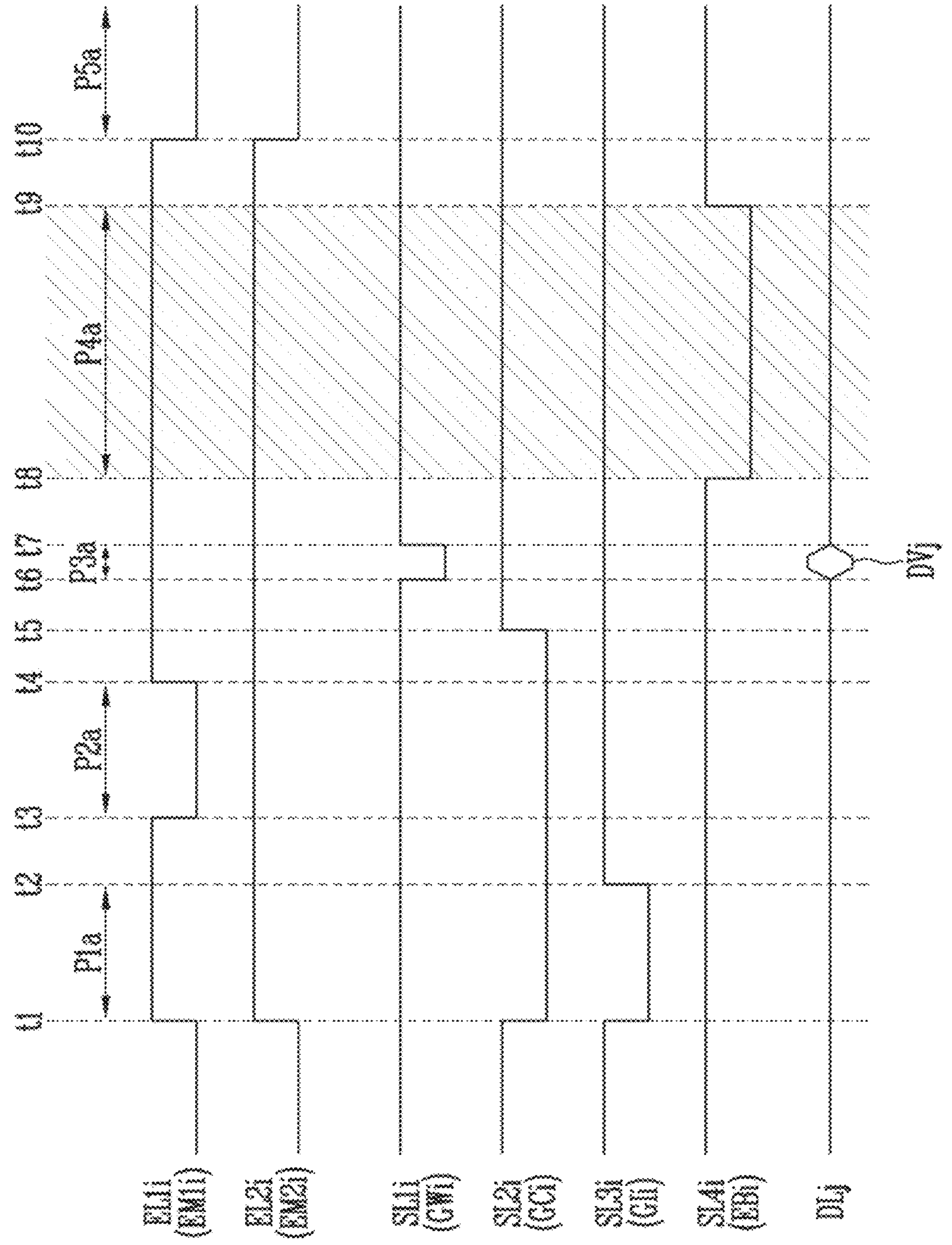

Accordingly, during the fourth period P4*a* from the eighth time point t8 to a ninth time point t9 shown in FIG. 3E, the on-bias may be applied to the first transistor T1. That is, the fourth period P4*a* may be an on-bias period (or a first on-bias period).

At the ninth time point t9, the fourth scan signal EBi may transit from a gate-on level to a gate-off level. Accordingly, the eighth transistor T8 and the ninth transistor T9 may be turned off.

The hysteresis characteristic (that is, the threshold voltage shift) of the first transistor T1 may be improved, by applying the on-bias to the first transistor T1 in the fourth period P4*a*.

Therefore, the pixel PX and the display device 1000 of FIG. 1 according to an operation of FIG. 3A may remove or improve the hysteresis characteristic while removing a threshold voltage deviation of the first transistor T1, and thus an image defect (flicker, color drag, a luminance decrease, or the like) may be improved. In particular, the hysteresis characteristic (the difference of the threshold voltage shift) may be more effectively improved, by applying a bias with a substantially constant voltage to the source electrode of the first transistor T1 (or the driving transistor) to match a driving current direction and a bias direction.

Figure 3F:
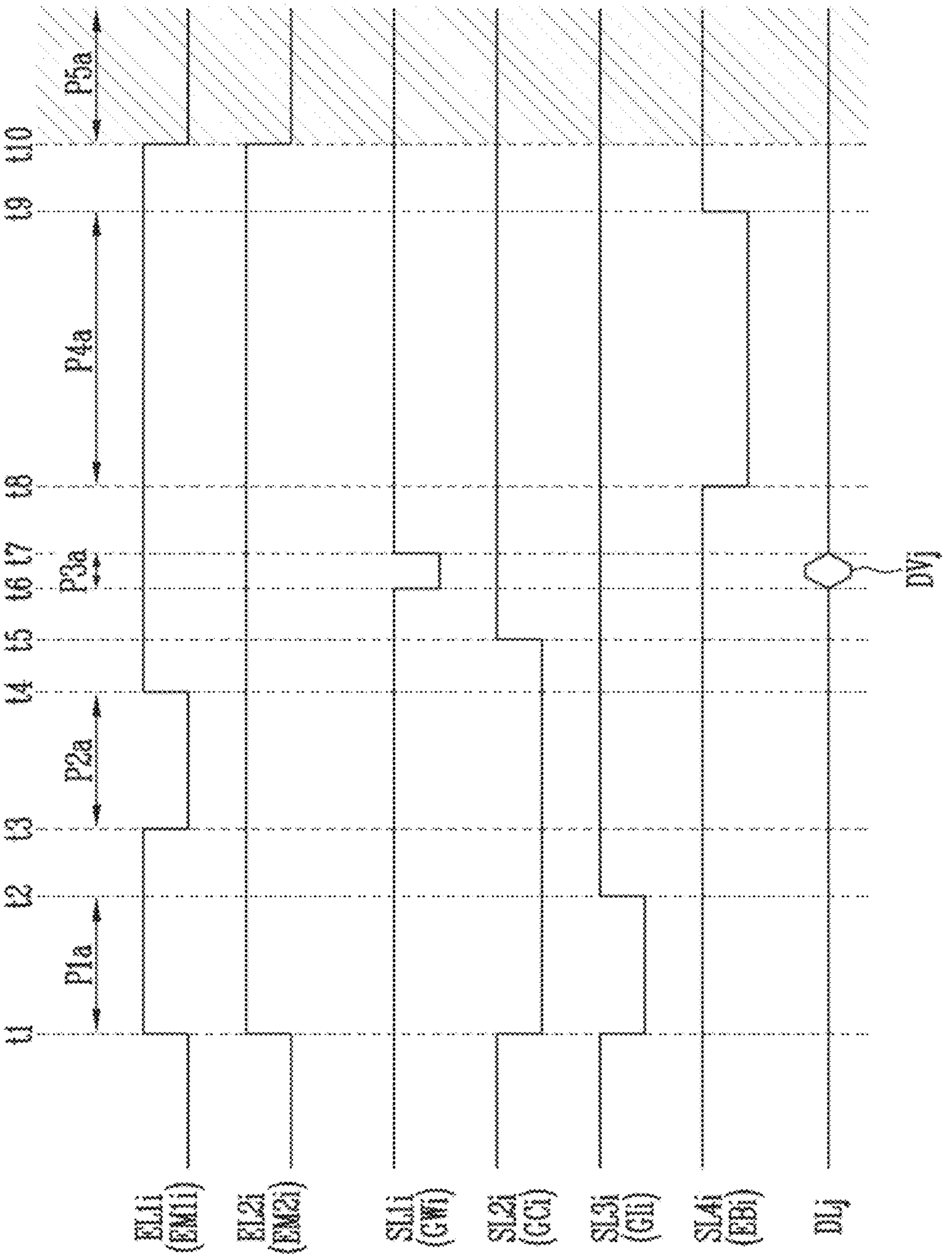

Referring to FIG. 3F, at a tenth time point t10, the first and second emission control signals EM1*i* and EM2*i* may transit from a gate-off level to a gate-on level. Accordingly, since the sixth and seventh transistors T6 and T7 may be turned on, the pixel PX may emit light in a fifth period P5*a* after the tenth time point t10 shown in FIG. 3F. That is, the fifth period P5*a* may be an emission period (or a first emission period).

FIGS. 4A to 4D are timing diagrams of an embodiment of an operation of the pixel of FIG. 2A.

Figure 4A:
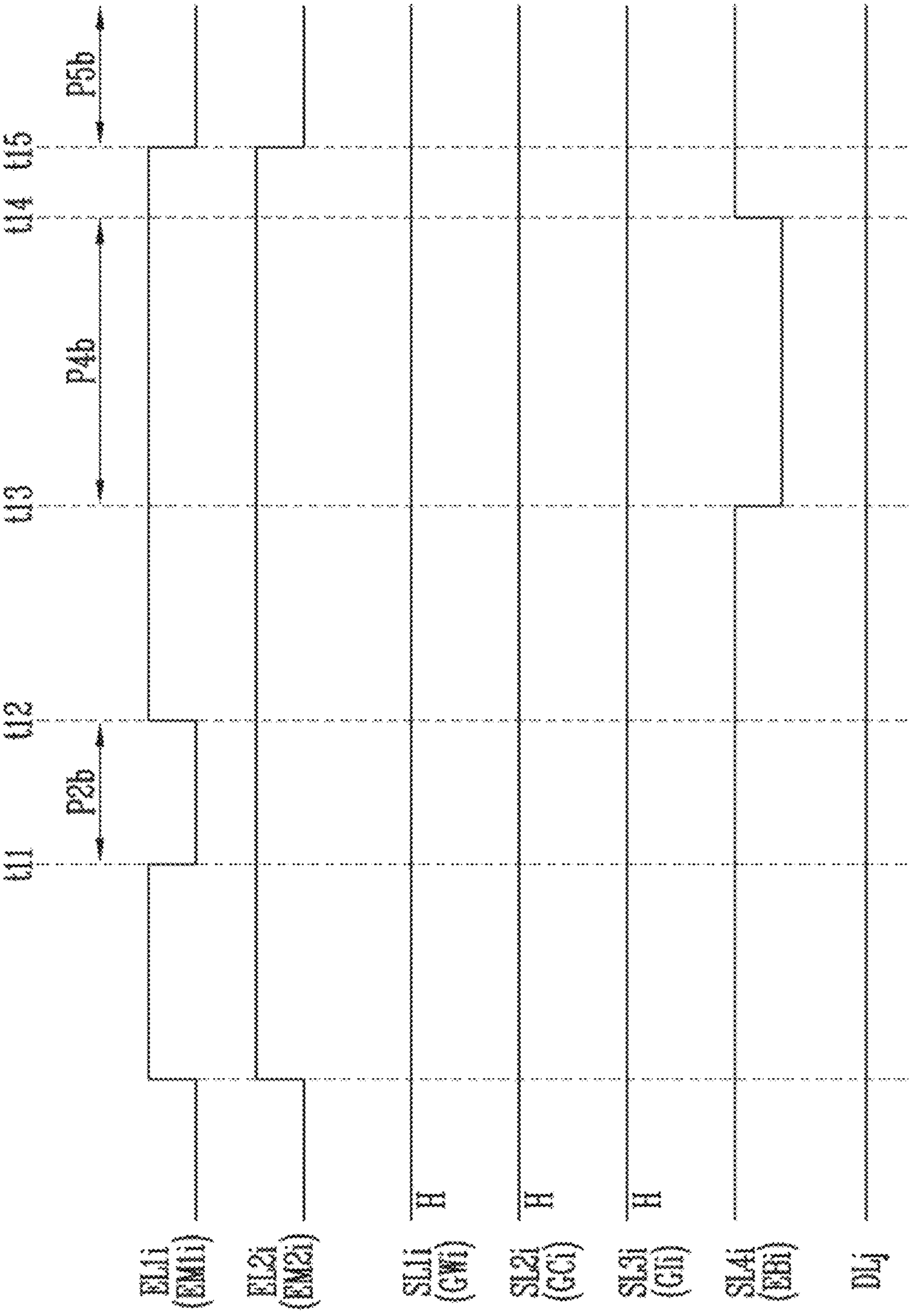
FIGS. 4A to 4D are timing diagrams of another embodiment of an operation of the pixel of FIG. 2A.

Referring to FIGS. 2A, 3A, and 4A, in order to maintain a luminance of an image output in the display scan period DSP illustrated in FIGS. 3A to 3F, an on-bias voltage may be applied to the first electrode of the first transistor T1 (for example, the source electrode or the fifth node N5) in a self-scan period SSP. For example, the self-scan period SSP may be a period continuously following the display scan period DSP in a frame period.

According to an image frame rate, one frame may include at least one self-scan period SSP. The self-scan period SSP may include an on-bias period (or a second on-bias period) of a sixth period P2*b* an on-bias period (or a third on-bias period) of a seventh period P4*b*, and an emission period (or a second emission period) of an eighth period P5*b*. In addition, the operation of the self-scan period SSP of FIG. 4A is substantially the same as or similar to the operation of the display scan period DSP of FIG. 3A except for signal supply for the initialization of the gate electrode of the first transistor T1 in the first period Pla of FIG. 3B, signal supply for the threshold voltage compensation in the second period P2*a* (or the threshold voltage compensation period) of FIG. 3C, and signal supply for the data signal writing in the third period P3*a* (or the data writing period) of FIG. 3D.

In an embodiment, the scan signal is not supplied to the second to fifth transistors T2, T3, T4, and T5 in the self-scan period SSP. For example, in the self-scan period SSP, the first scan signal GWi, the second scan signal GCi, and the third scan signal Gii respectively supplied to the first scan line SL1*i*, the second scan line SL2*i*, and the third scan line SL3*i* may have a gate-off level (or a high level (H)). Accordingly, in the self-scan period SSP, the gate electrode initialization period (for example, the first period Pla) of the first transistor T1, the threshold voltage compensation period (for example, the second period P2*a*), and the data writing period (for example, the third period P3*a*) are not included.

Figure 4B:
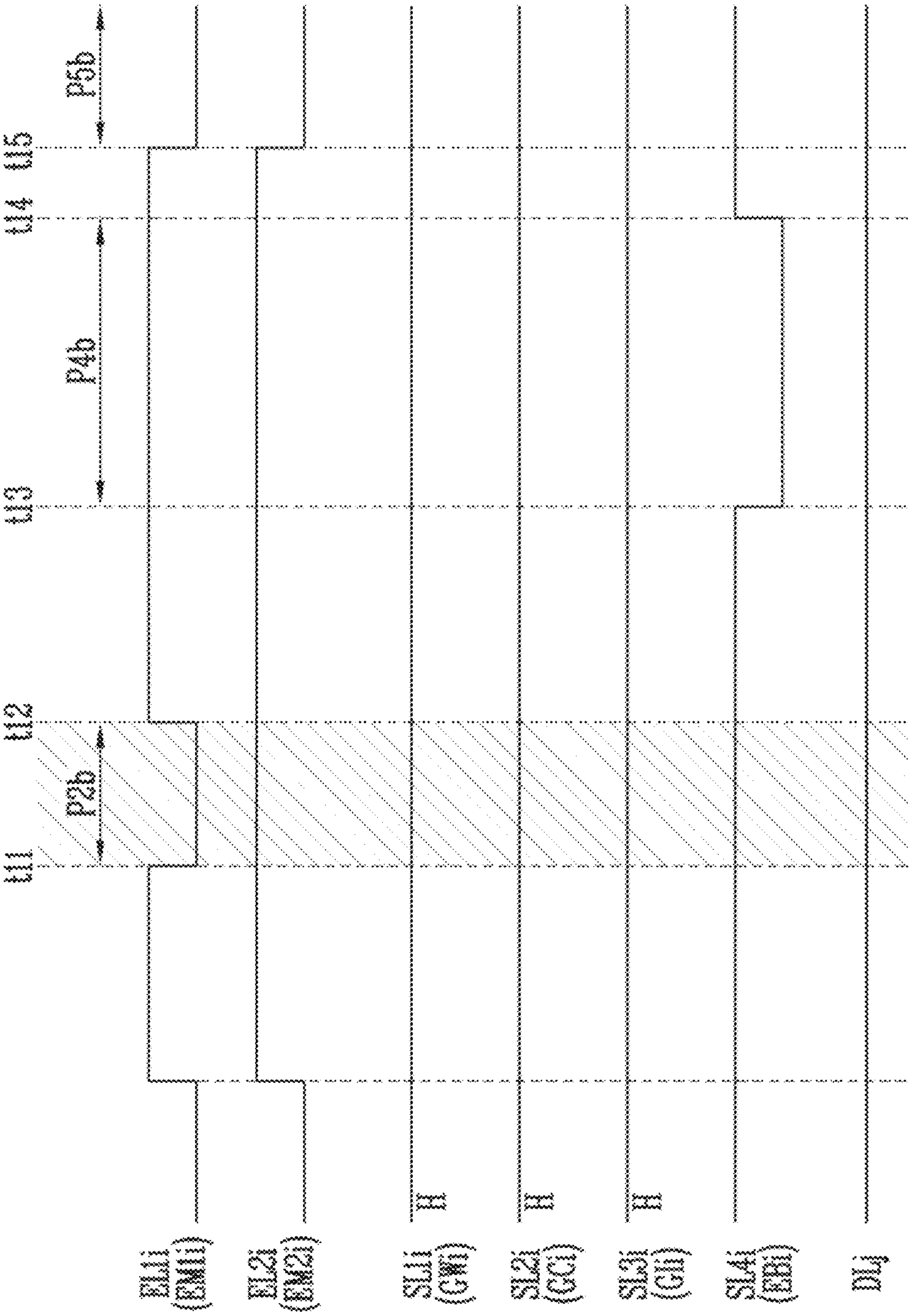

Specifically, referring to FIG. 4*b*, since the first emission control signal EM1*i* of the gate-on level is supplied during the sixth period P2*b* (or the second on-bias period) from an eleventh time point t11 to a twelfth time point t12 shown in FIG. 4B, the sixth transistor T6 may be turned on or may maintain a turn-on state. Accordingly, the voltage of the first power source VDD of the high voltage may be supplied to the first electrode (or the source electrode) of the first transistor T1, and thus the first transistor T1 may have an on-bias state.

Figure 4C:
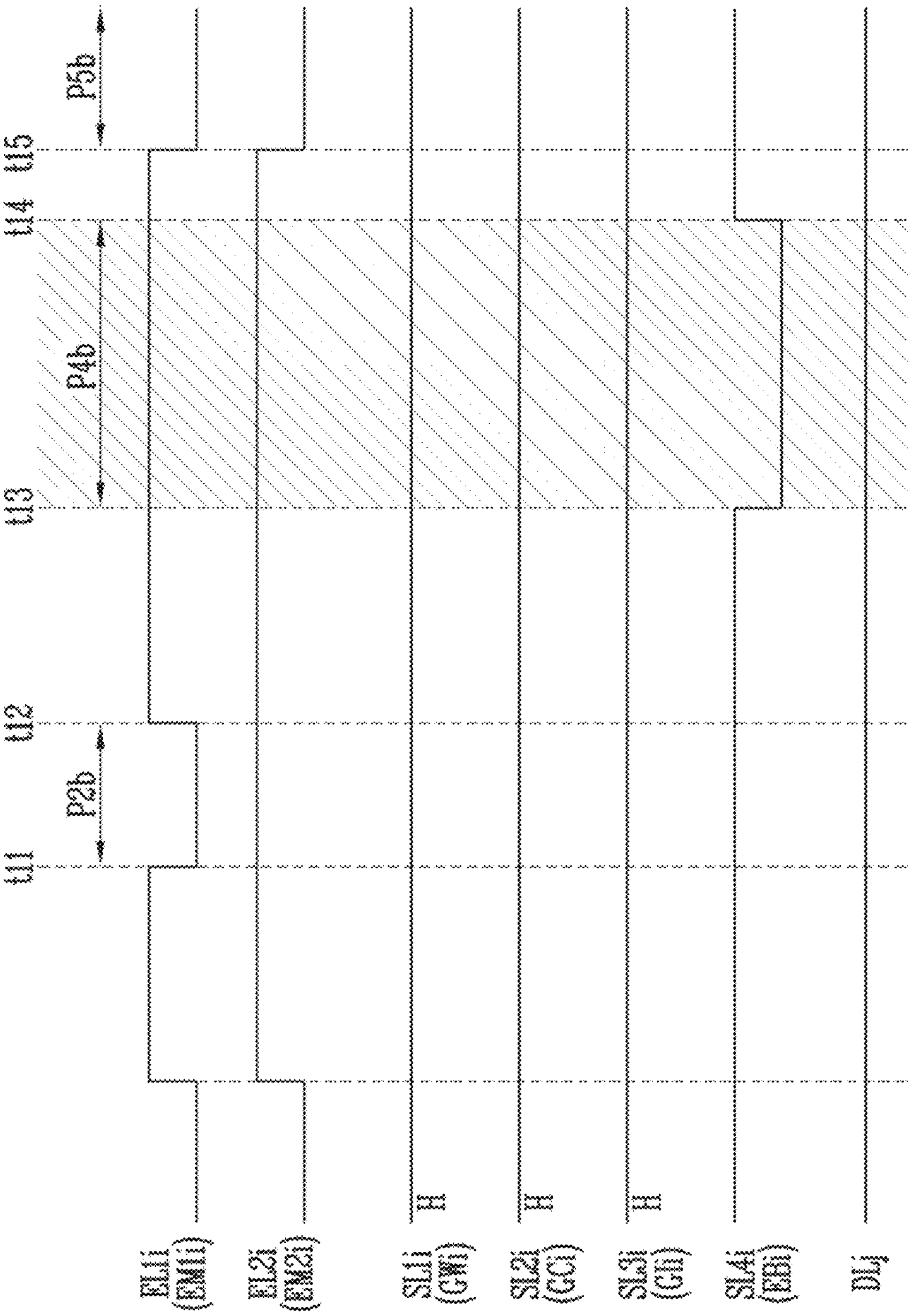

Since the fourth scan signal EBi of the gate-on level is supplied during the seventh period P4*b* (or the third on-bias period) from a thirteenth time point t13 to a fourteenth time point t14 shown in FIG. 4C, the ninth transistor T9 may be turned on or may maintain a turn-on state. Since the ninth transistor T9 is turned on, the voltage of the bias power source Vbs may be supplied to the fifth node N5 (or the source electrode of the first transistor T1). Therefore, the voltage of the bias power source Vbs having the positive voltage may be supplied to the first electrode (or the source electrode) of the first transistor T1.

In addition, the eighth transistor T8 may be turned on. Accordingly, the voltage of the anode initialization power source Vaint may be supplied to the fourth node N4 (or the first electrode of the light emitting element LD), and thus the fourth node N4 may be initialized to the voltage of the anode initialization power source Vaint.

Figure 4D:
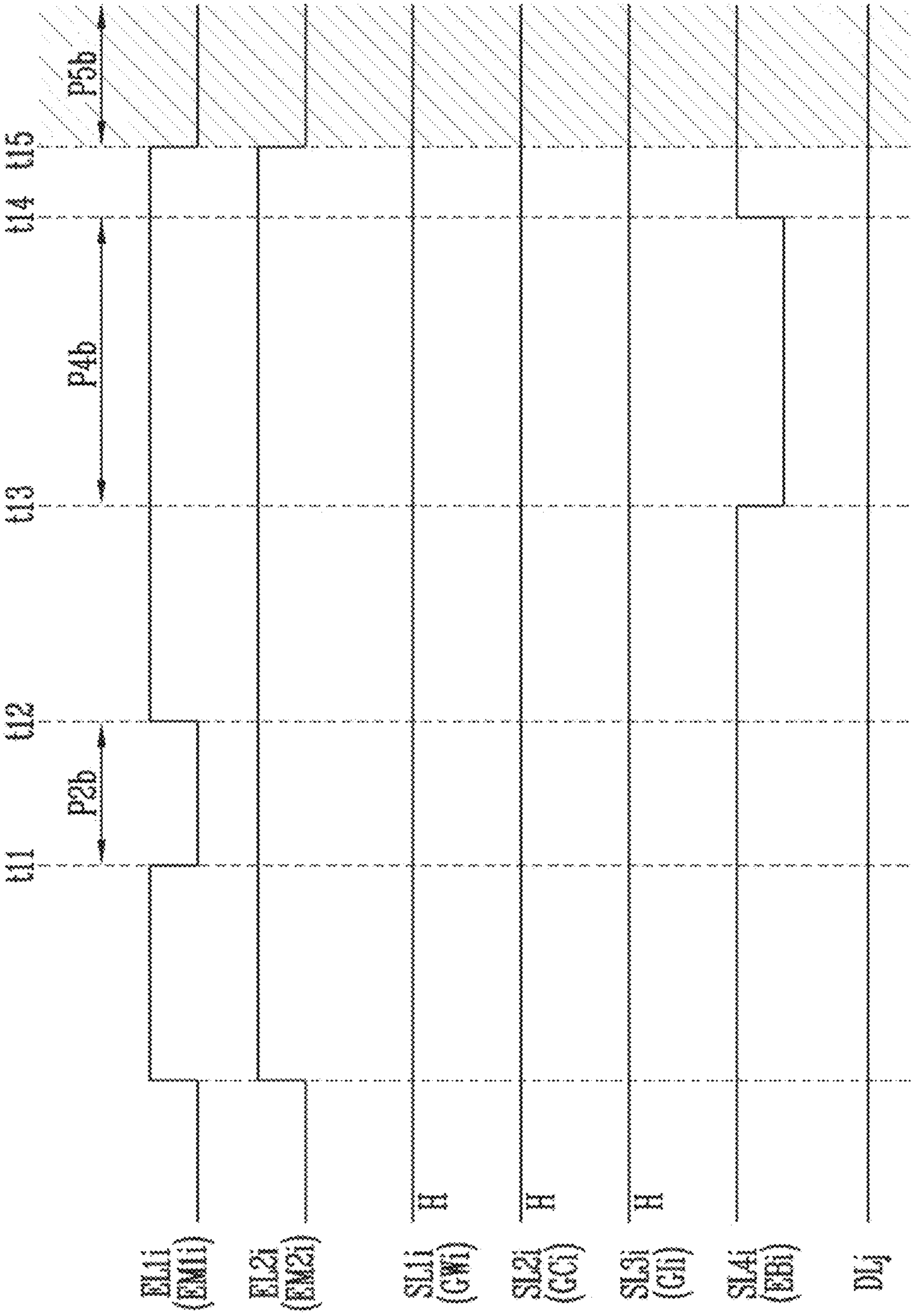

Since both of the first emission control signal EM1*i* and the second emission control signal EM2*i* have the gate-on level in the eighth period P5*b* (or the second emission period) after a fifteenth time point t15 shown in FIG. 4D, the sixth and seventh transistors T6 and T7 may be turned on, and thus the pixel PX may emit light.

Here, the fourth scan signal EBi and the first and second emission control signals EM1*i* and EM2*i* may be supplied at the first frequency regardless of the image refresh rate. Therefore, even in a case where the image refresh rate is changed, the initialization operation of the light emitting element LD and the application of the on-bias in the on-bias period (the fourth period P4*a*, the sixth period P2*b*, and/or the seventh period P4*b*) may be periodically performed always. Therefore, flicker may be improved in response to various image refresh rates (particularly, low-frequency driving).

In the self-scan period SSP, the data driver 800 of FIG. 1 may not supply the data signal to the pixel PX. Therefore, power consumption may be further reduced.

Figure 5A:
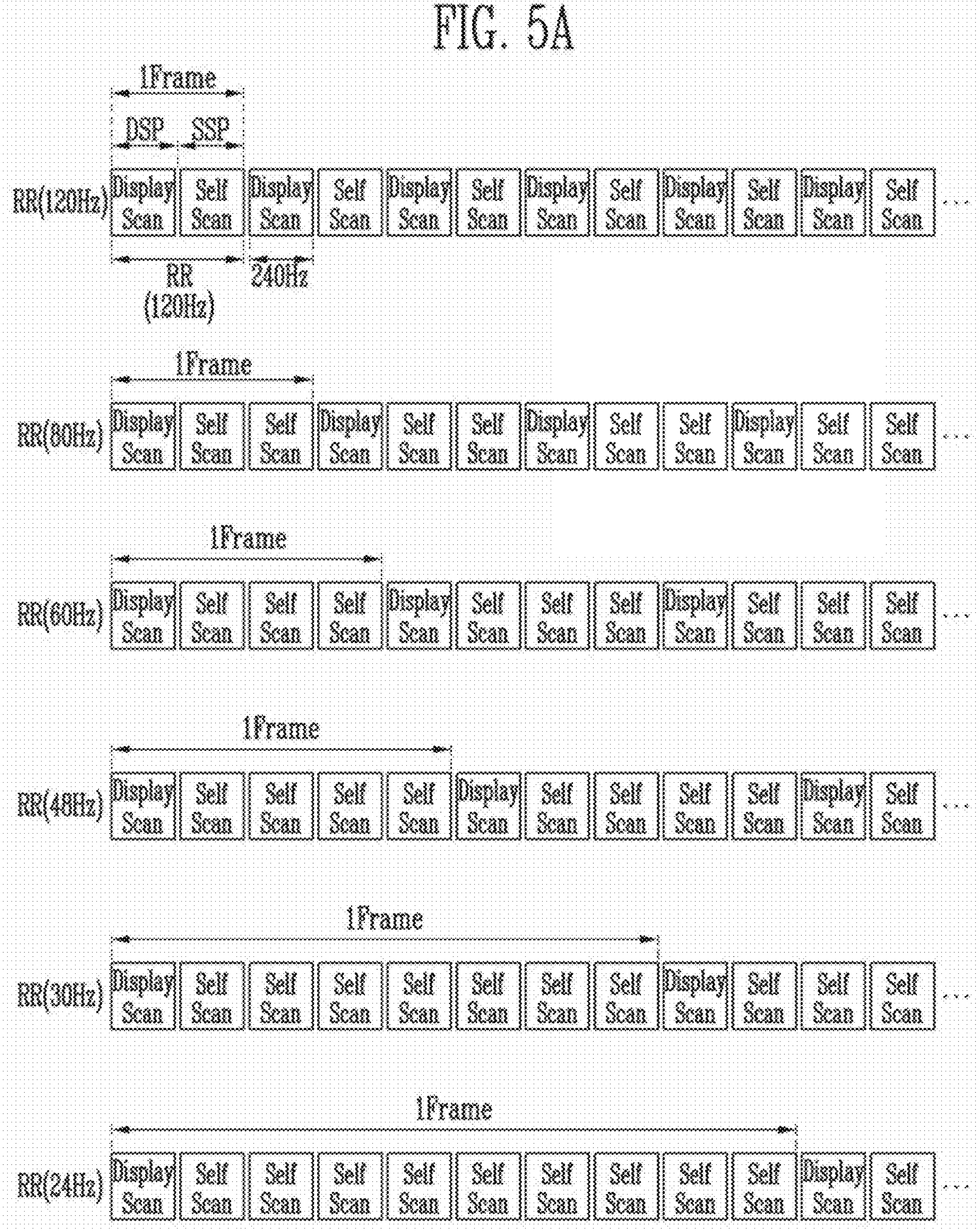
FIG. 5A is a conceptual diagram of an embodiment of a method of driving a display device according to an image refresh rate.
Figure 5B:
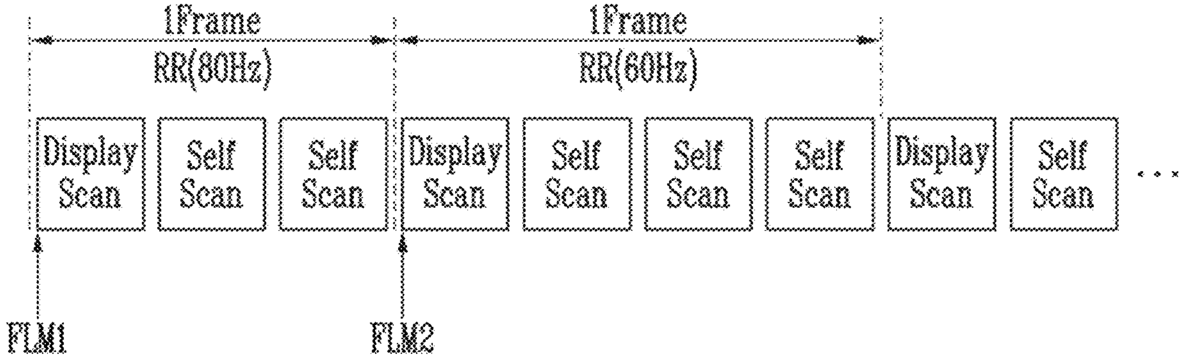
FIG. 5B is a conceptual diagram illustrating of another embodiment of a method of driving the display device according to the image refresh rate.

FIG. 5A is a conceptual diagram of an embodiment of a method of driving the display device according to the image refresh rate, and FIG. 5B is a conceptual diagram of an embodiment of a method of driving the display device according to the image refresh rate.

Referring to FIGS. 1 to 5A, the pixel PX may perform the operation of FIGS. 3A to 3G in the display scan period DSP and perform the operation of FIGS. 4A to 4D in the self-scan period SSP.

In an embodiment, the output frequency of the first scan signal GWi and the second scan signal GCi may vary according to an image refresh rate RR. For example, the first scan signal GWi and the second scan signal GCi may be output at the same frequency (second frequency) as the image refresh rate RR.

In an embodiment, regardless of the image refresh rate RR, the third scan signal GIi, the fourth scan signal EBi, the first emission control signal EM1*i*, and the second emission control signal EM2*i* may be output at a substantially constant frequency (first frequency). For example, an output frequency of the third scan signal GIi, the fourth scan signal EBi, the first emission control signal EM1*i*, and the second emission control signal EM2*i* may be set to twice a maximum refresh rate of the display device 1000.

In an embodiment, lengths of the display scan period DSP and the self-scan period SSP may be substantially the same.

However, the number of self-scan periods SSP included in one frame period may be determined according to the image refresh rate RR.

As shown in FIG. 5A, when the display device 1000 is driven at an image refresh rate RR of 120 Hz, one frame period may include one display scan period DSP and one self-scan period SSP. Accordingly, when the display device 1000 is driven at the image refresh rate RR of 120 Hz, each of the pixels PX may alternately repeat emission and non-emission twice during one frame period.

In addition, when the display device 1000 is driven at an image refresh rate RR of 80 Hz, one frame period may include one display scan period DSP and two successive self-scan periods SSP. Accordingly, when the display device 1000 is driven at the image refresh rate RR of 80 Hz, each of the pixels PX may alternately repeat emission and non-emission three times during one frame period.

In a method similar to that described above, the display device 1000 may be driven at a driving frequency of 60 Hz, 48 Hz, 30 Hz, 24 Hz, 1 Hz, or the like by adjusting the number of self-scan periods SSP included in one frame period. In other words, the display device 1000 may support various image refresh rates RR with frequencies corresponding to an aliquot of the first frequency.

In addition, as the driving frequency decreases, the number of self-scan periods SSP increases, and thus on-bias and/or off-bias of a predetermined size may be periodically applied to each of the first transistors T1 included in each of the pixels PX. Therefore, luminance reduction, flicker, and screen drag in low-frequency driving may be improved.

As shown in FIG. 5B, the display device 1000 may display an image using different start pulses FLM1 and FLM2 according to the image refresh rate RR. For example, when the display device 1000 is driven at an image refresh rate RR of 80 Hz, the display device 1000 may display an image using the first start pulse FLM1, and when the display device 1000 is driven at an image refresh rate RR of 60 Hz, the display device 1000 may display an image using the second start pulse FLM2. At this time, since the first scan driver 200 and the second scan driver 300 are driven at different frequencies (or second frequencies) according to the image refresh rate RR, the first start pulse FLM1 and the second start pulse FLM2 may include a first scan start pulse and a second scan start pulse different from each other.

Figure 6A:
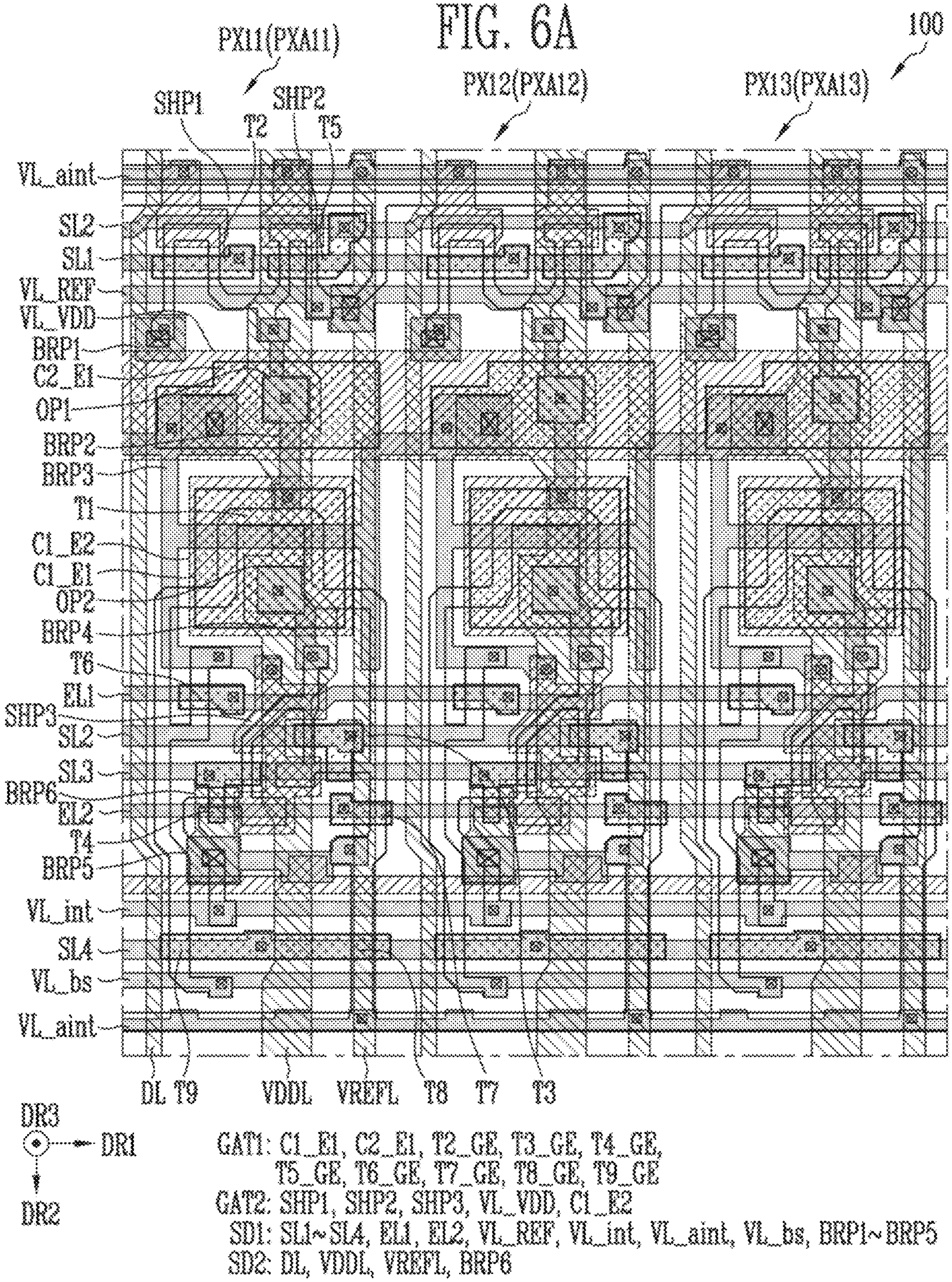
FIG. 6A is a schematic plan view of an embodiment of a plurality of pixels constructed according to the principles of the invention based on the pixel shown in FIG. 2A.
Figure 6B:
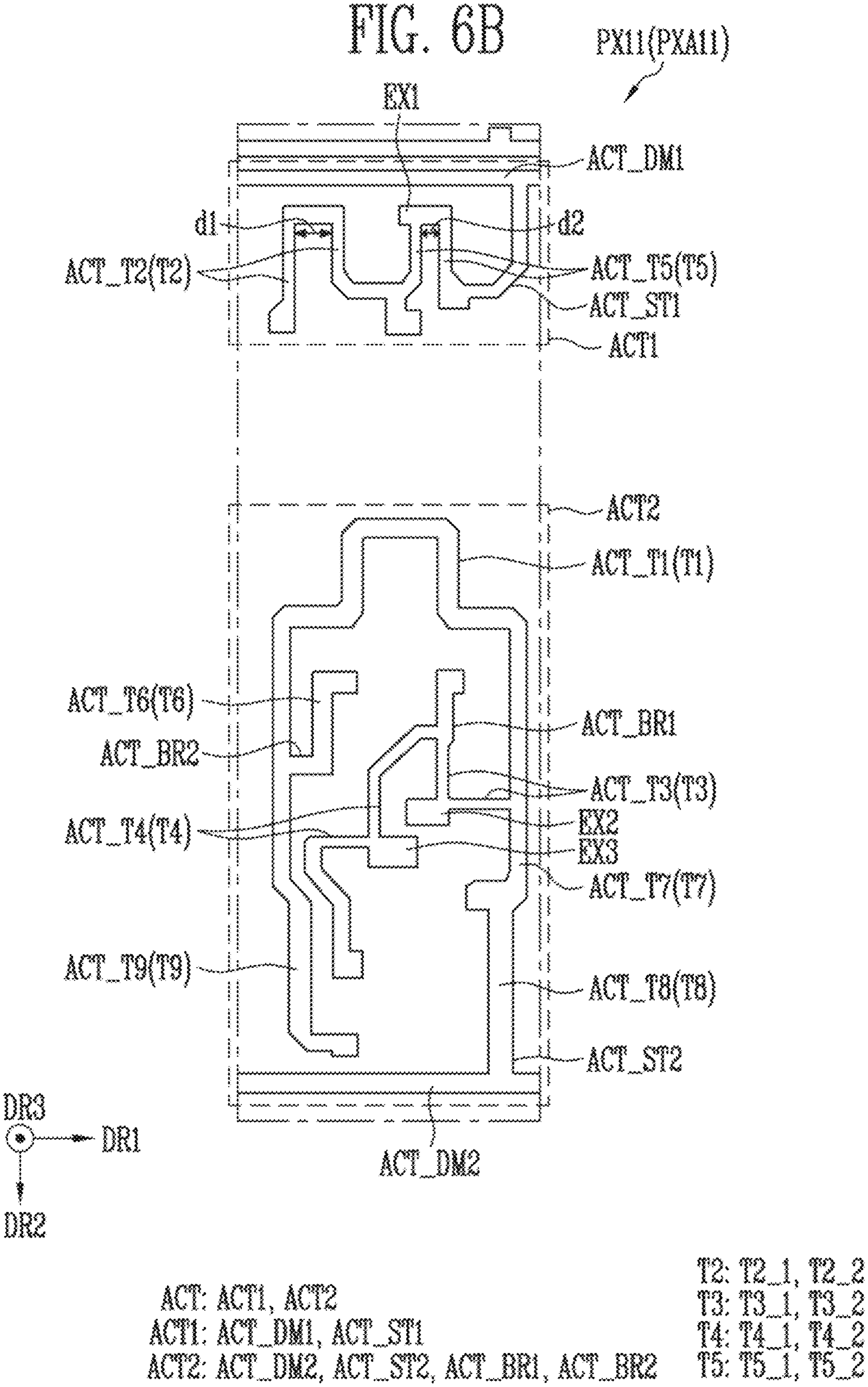
FIG. 6B is a plan view of an embodiment of a semiconductor layer included in the pixel of FIG. 6A.
Figure 6C:
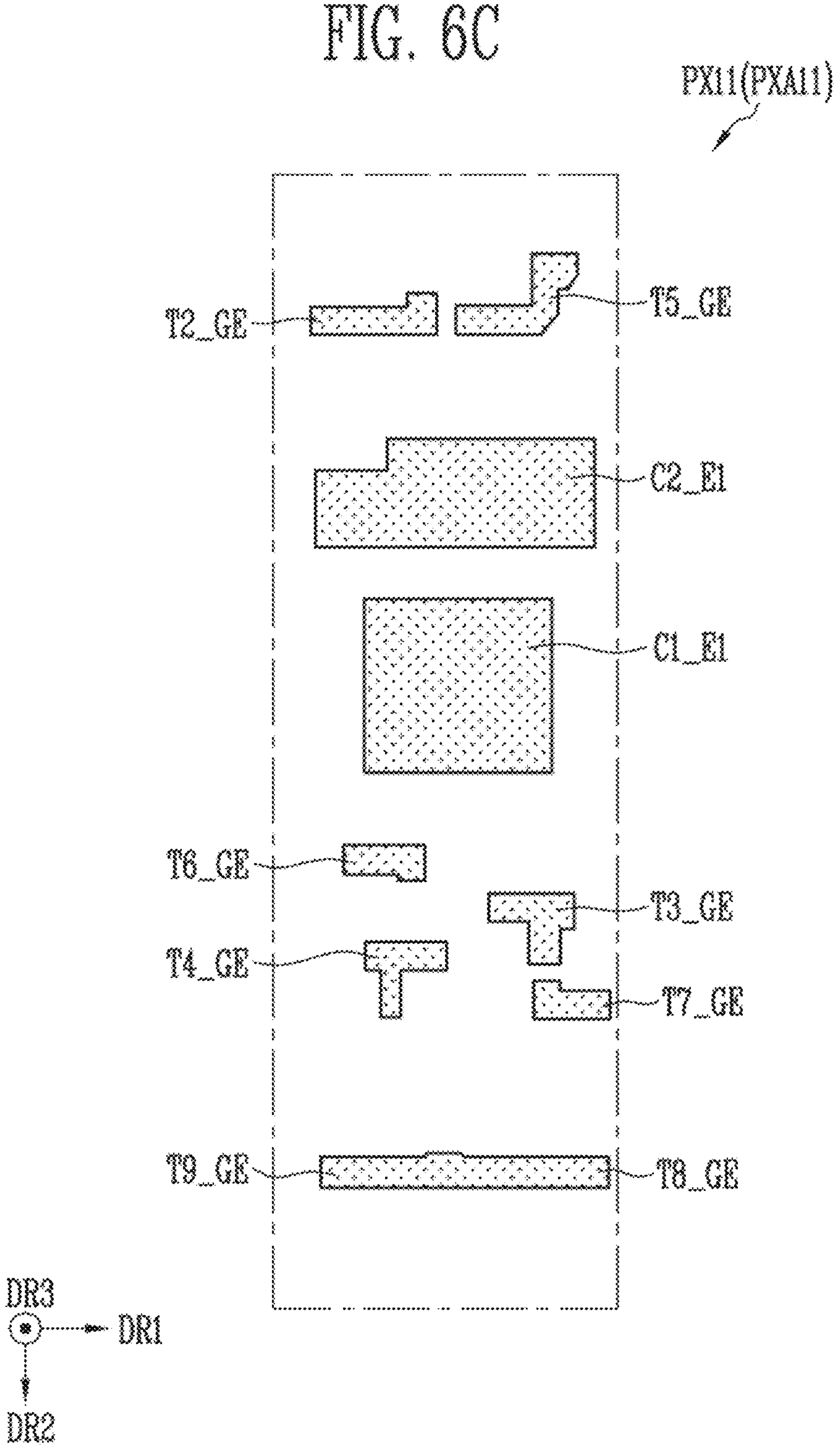
FIG. 6C is a plan view of an embodiment of a first conductive layer included in the pixel of FIG. 6A.
Figure 6D:
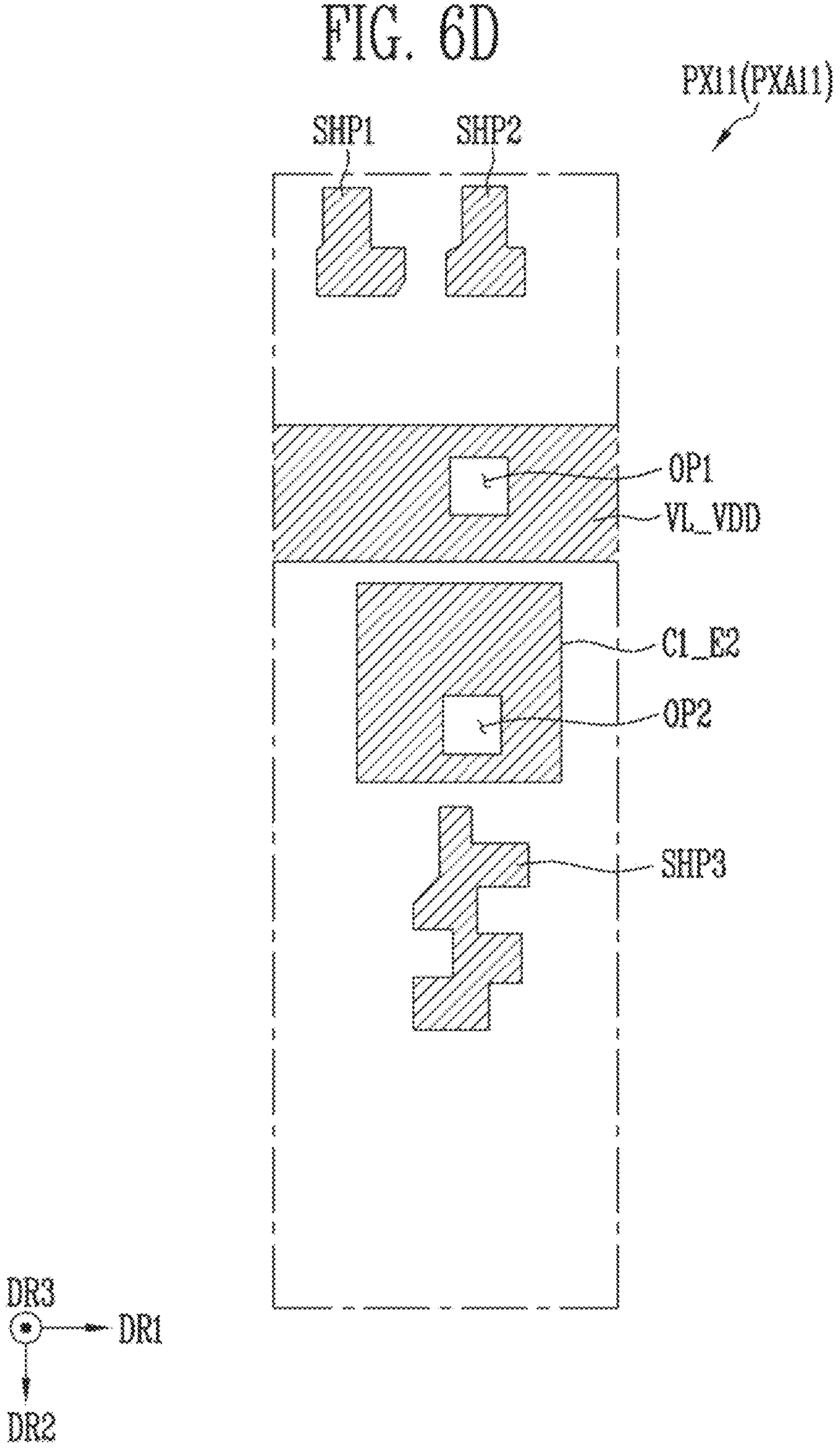
FIG. 6D is a plan view of an embodiment of a second conductive layer included in the pixel of FIG. 6A.
Figure 6E:
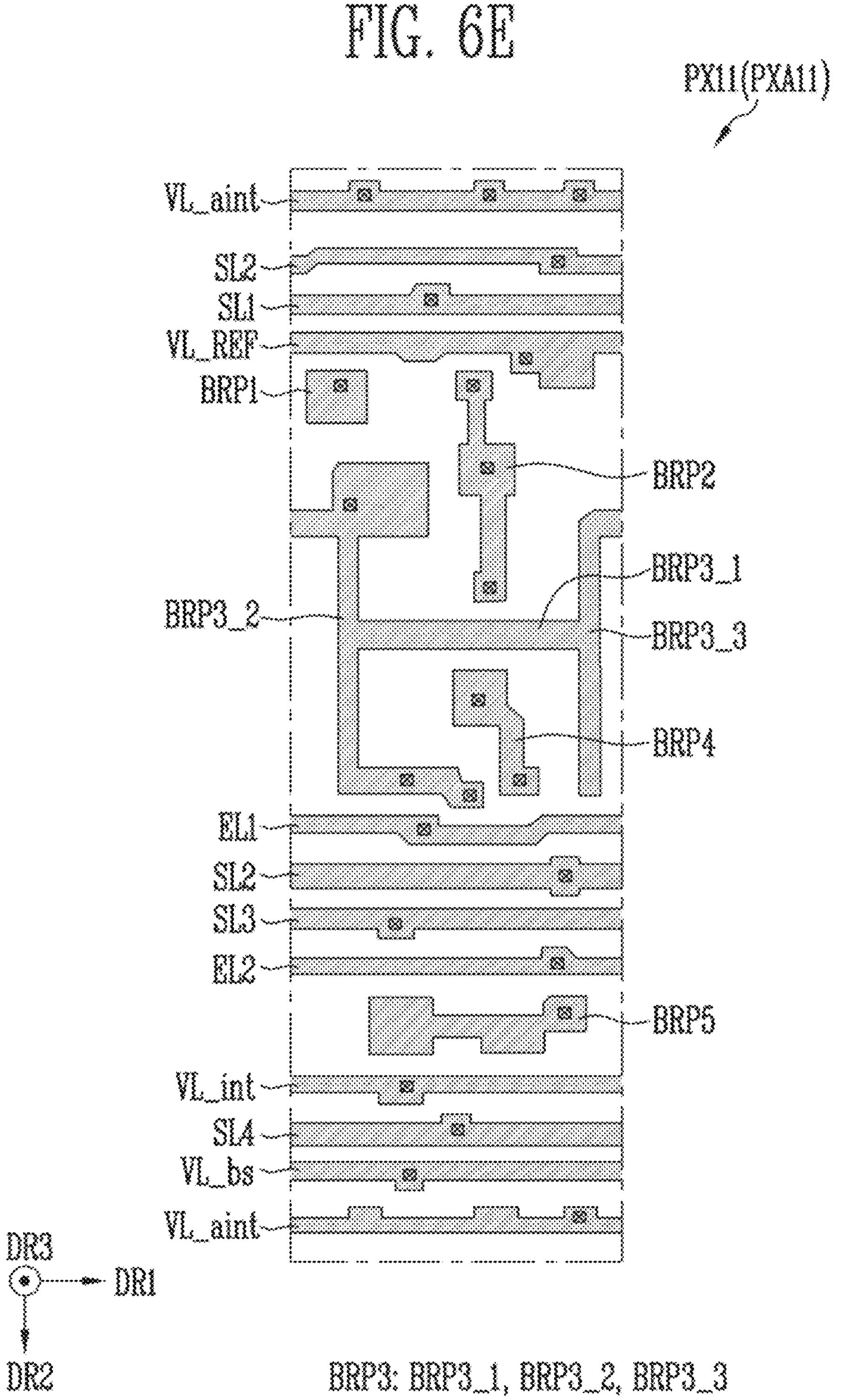
FIG. 6E is a plan view of an embodiment of a third conductive layer included in the pixel of FIG. 6A.
Figure 6F:
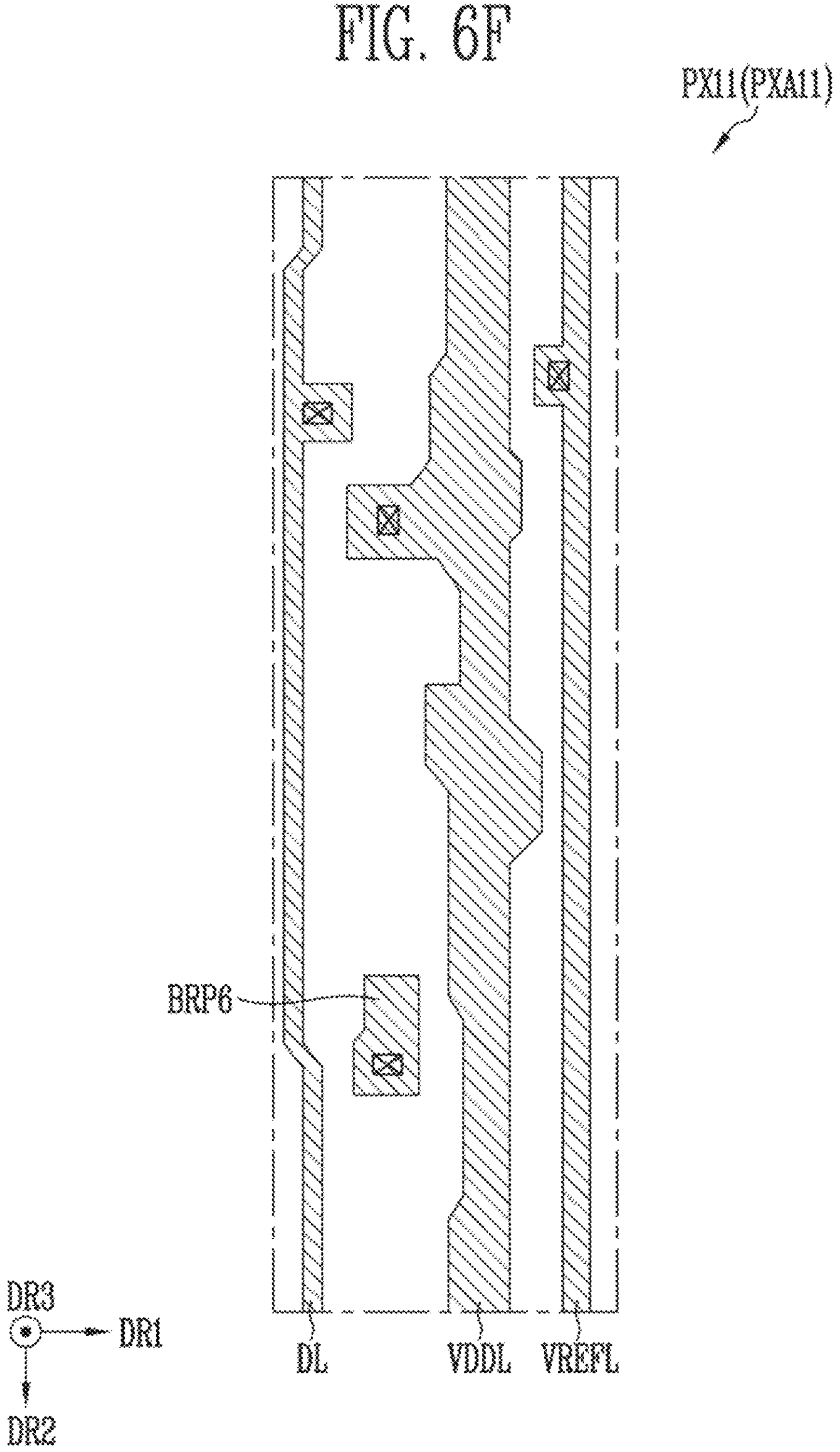
FIG. 6F is a plan view of an embodiment of a fourth conductive layer included in the pixel of FIG. 6A.

FIG. 6A is a schematic plan view of an embodiment of a plurality of pixels constructed according to the principles of the invention based on the pixel shown in FIG. 2A. FIG. 6B is a plan view of an embodiment of a semiconductor layer included in the pixel of FIG. 6A. FIG. 6C is a plan view of an embodiment of a first conductive layer included in the pixel of FIG. 6A. FIG. 6D is a plan view of an embodiment of a second conductive layer included in the pixel of FIG. 6A. FIG. 6E is a plan view of an embodiment of a third conductive layer included in the pixel of FIG. 6A. FIG. 6F is a plan view of an embodiment of a fourth conductive layer included in the pixel of FIG. 6A.

Referring to FIGS. 1, 2A, and 6A, the display panel 100 may include an eleventh pixel PX11 (or an eleventh pixel area PXA11), a twelfth pixel PX12 (or a twelfth pixel area PXA12), and a thirteenth pixel PX13 (or a thirteenth pixel area PXA13). The eleventh pixel PX11, the twelfth pixel PX12, and the thirteenth pixel PX13 may define the configuration of one unit pixel.

According to an embodiment, the eleventh to thirteenth pixels PX11 to PX13 may emit light in different colors. For example, the eleventh pixel PX11 may be a red pixel emitting red light, the twelfth pixel PX12 may be a green pixel emitting green light, and the thirteenth pixel PX13 may be a blue pixel emitting blue light. However, the color, type, number, and/or the like of the pixels defining the unit pixel are not particularly limited, and, for example, the color of light emitted by each of the pixels may be variously changed. According to an embodiment, the eleventh to thirteenth pixels PX11 to PX13 may emit light in the substantially the same color. For example, the eleventh to thirteenth pixels PX11 to PX13 may be blue pixels emitting blue light.

Since the eleventh to thirteenth pixels PX11 to PX13 (or pixel driving circuits of the eleventh to thirteenth pixels PX11 to PX13) are substantially the same or similar to each other, hereinafter, the eleventh pixel PX11 is described by encompassing the eleventh to thirteenth pixels PX11 to PX13.

The eleventh pixel PX11 may include a semiconductor layer ACT, a first conductive layer GAT1, a second conductive layer GAT2, a third conductive layer SD1, and a fourth conductive layer SD2. The semiconductor layer ACT, the first conductive layer GAT1, the second conductive layer GAT2, the third conductive layer SD1, and the fourth conductive layer SD2 may be formed on different layers through different processes.

The semiconductor layer ACT may be an active layer forming a channel of the first to ninth transistors T1 to T9. The semiconductor layer ACT may include a source region (or a first region) and a drain region (or a second region) that are in contact with a first electrode (for example, a source electrode) and a second electrode (for example, a drain electrode) of each of the first to ninth transistors T1 to T9). A region between the source region and the drain region may be a channel region. The channel region of the semiconductor pattern may be an intrinsic semiconductor as a semiconductor pattern that is not doped with an impurity. The source region and the drain region may be a semiconductor pattern doped with an impurity.

Referring to FIGS. 6A and 6B, the semiconductor layer ACT may include a first semiconductor pattern ACT1 and a second semiconductor pattern ACT2.

The first semiconductor pattern ACT1 may include a first dummy portion ACT_DM1 and a first stem portion ACT_ST1. The first dummy portion ACT_DM1 and the first stem portion ACT_ST1 may be interconnected and integrally formed.

The first dummy portion ACT_DM1 may extend in a first direction DR1 and may be positioned adjacent to one side of the eleventh pixel area PXA11. The first dummy portion ACT_DM1 may be connected to a reference power source line VL_REF formed of the third conductive layer SD1 through a contact hole. Since the first dummy portion ACT_DM1 continuously extends in the eleventh pixel area PXA11, the twelfth pixel area PXA12, and the thirteenth pixel area PXA13, the first semiconductor pattern ACT1 may be interconnected in the first direction DR1 on the display panel 100.

The first stem portion ACT_ST1 may include a second sub-semiconductor pattern ACT_T2 and a fifth sub-semiconductor pattern ACT_T5. The second sub-semiconductor pattern ACT_T2 may define a channel of the second transistor T2, and the fifth sub-semiconductor pattern ACT_T5 may define a channel of the fifth transistor T5. In an embodiment, the second transistor T2 may include (2_1)-th and (2_2)-th transistors T2_1 and T2_2, and the second sub-semiconductor pattern ACT_T2 may include channel regions of the (2_1)-th and (2_2)-th transistors T2_1 and T2_2, that is, two channel regions connected in series.

Similarly, the fifth transistor T5 may include (5_1)-th and (5_2)-th transistors T5_1 and T5_2, and the fifth sub-semiconductor pattern ACT_T5 may include channel regions of the (5_1)-th and (5_2)-th transistors T5_1 and T5_2, that is, two channel regions connected in series. Each of the second sub-semiconductor pattern ACT_T2 and the fifth sub-semiconductor pattern ACT_T5 may include a bent portion for forming a dual gate.

The bent portion of the second sub-semiconductor pattern ACT_T2 may overlap the first shielding patterns SHP1 formed of the second conductive layer GAT2 in a third direction DR3, and thus a capacitance is formed. The bent portion of the fifth sub-semiconductor pattern ACT_T5 may overlap the second shielding pattern SHP2 formed of the second conductive layer GAT2 in the third direction DR3, and thus a capacitance is formed. The first and second shielding patterns SHP1 and SHP2 may be connected to an anode initialization power source line VL_aint through a contact hole, and may receive the anode initialization power source Vaint. Accordingly, leakage current generated at the floating node (or the bent portion) of the second transistor T2 and the fifth transistor T5 may be minimized.

According to an embodiment, as shown in FIG. 6B, a first distance d1 of the bent portion of the second sub-semiconductor pattern ACT_T2 in the first direction DR1 may be greater than a second direction d2 of the bent portion of the fifth sub-semiconductor pattern ACT_T5 in the first direction DR1. The bent portion of the fifth sub-semiconductor pattern ACT_T5 may include a first protruding expansion portion EX1 on one side. The first expansion portion EX1 may increase the area of the fifth sub-semiconductor pattern ACT_T5. Accordingly, the capacitance may be increased at the floating node (or the bent portion) of the second transistor T2 and the fifth transistor T5. In general, as the capacitance across the floating node of the transistor increases, the leakage current further decreases.

The second semiconductor pattern ACT2 may include a second dummy portion ACT_DM2 and a second stem portion ACT_ST2. The second dummy portion ACT_DM2 and the second stem portion ACT_ST2 may be interconnected and integrally formed.

The second dummy portion ACT_DM2 may extend in the first direction DR1 and may be positioned adjacent to another side of the eleventh pixel area PXA11. The second dummy portion ACT_DM2 may be connected to the anode initialization power source line VL_aint formed of the third conductive layer SD1 through a contact hole. Since the second dummy portion ACT_DM2 continuously extends in the eleventh pixel area PXA11, the twelfth pixel area PXA12, and the thirteenth pixel area PXA13, the second semiconductor pattern ACT2 may be interconnected in the first direction DR1 on the display panel 100.

The second stem portion ACT_ST2 may include a first branch portion ACT_BR1 and a second branch portion ACT_BR2. The second stem portion ACT_ST2 may include an eighth sub-semiconductor pattern ACT_T8, a seventh sub-semiconductor pattern ACT_T7, a first sub-semiconductor pattern ACT_T1, and a ninth sub-semiconductor pattern ACT_T9 along a counterclockwise direction. The eighth sub-semiconductor pattern ACT_T8 may constitute a channel of the eighth transistor T8, the seventh sub-semiconductor pattern ACT_T7 may constitute a channel of the seventh transistor T7, the first sub-semiconductor pattern ACT_T1 may define a channel of the first transistor T1, and the ninth sub-semiconductor pattern ACT_T9 may define a channel of the ninth transistor T9.

According to an embodiment, the first sub-semiconductor pattern ACT_T1 may include a bent portion for improving a channel capacitance.

The first branch portion ACT_BR1 may be branched between the first sub-semiconductor pattern ACT_T1 and the seventh sub-semiconductor pattern ACT_T7 to be formed. The first branch portion ACT_BR1 may include a third sub-semiconductor pattern ACT_T3 and a fourth sub-semiconductor pattern ACT_T4.

The third sub-semiconductor pattern ACT_T3 may define a channel of the third transistor T3, and the fourth sub-semiconductor pattern ACT_T4 may define a channel of the fourth transistor T4. In an embodiment, the third transistor T3 may include (3_1)-th and (3_2)-th transistors T3_1 and T3_2, and the third sub-semiconductor pattern ACT_T3 may include channel regions of the (3_1)-th and (3_2)-th transistors T3_1 and T3_2, that is, two channel regions connected in series. Similarly, the fourth transistor T4 may include (4_1)-th and (4_2)-th transistors T4_1 and T4_2, and the fourth sub-semiconductor pattern ACT_T4 may include channel regions of the (4_1)-th and (4_2)-th transistors T4_1 and T4_2, that is, two channel regions connected in series. Each of the third sub-semiconductor pattern ACT_T3 and the fourth sub-semiconductor pattern ACT_T4 may include a bent portion for forming a dual gate. At this time, the bent portions may overlap the third shielding pattern SHP3 (shown in FIG. 6D) formed of the second conductive layer GAT2.

The respective bent portions of the third sub-semiconductor pattern ACT_T3 and the fourth sub-semiconductor pattern ACT_T4 may overlap the third shielding pattern SHP3 formed of the second conductive layer GAT2 in the third direction DR3, and thus a capacitance may be formed. Referring to FIGS. 6C and 6D, the third shielding pattern SHP3 may be connected through a (1_1)-th power source line VL_VDD through a third bridge pattern BRP3 and may receive the first power source VDD. Accordingly, leakage current generated at the floating node (or the bent portion) of the third transistor T3 and the fourth transistor T4 may be minimized.

According to an embodiment, the bent portion of the third sub-semiconductor pattern ACT_T3 may include a second expansion portion EX2 on one side, and the bent portion of the fourth sub-semiconductor pattern ACT_T4 may include a third expansion portion EX3 on one side. The second expansion portion EX2 may increase the area of the third sub-semiconductor pattern ACT_T3, and the third expansion portion EX3 may increase the area of the fourth sub-semiconductor pattern ACT_T4. Accordingly, capacitance may be increased at the floating node (or the bent portion) of the third transistor T3 and the fourth transistor T4. In general, as the capacitance across the floating node of the transistor increases, the leakage current may further decrease.

Magnitudes of the capacitance formed at the floating node (or the bent portion) of the second transistor T2, the third transistor T3, the fourth transistor T4, and the fifth transistor T5 may be formed to be substantially the same.

The second portion ACT_BR2 may be branched between the first sub-semiconductor pattern ACT_T1 and the ninth sub-semiconductor pattern ACT_T9 and may be formed. The second branch portion ACT_BR2 may include a sixth sub-semiconductor pattern ACT_T6. The sixth sub-semiconductor pattern ACT_T6 may define a channel of the sixth transistor T6.

As described above, since each of the first semiconductor pattern ACT1 and the second semiconductor pattern ACT2 is continuous in the first direction DR1 by the first and second dummy portions ACT_DM1 and ACT_DM2, defects due to static electricity may be reduced during manufacture. Therefore, an increase in a yield may be expected.

Referring to FIGS. 6A to 6C, the first conductive layer GAT1 may include an eleventh capacitor electrode C1_E1, a twenty-first capacitor electrode C2_E1, and gate patterns T2_GE, T3_GE, T4_GE, T5_GE, T6_GE, T7_GE, T8_GE, and T9_GE of the second to ninth transistors T2 to T9.

The eleventh capacitor electrode C1_E1 may have the specific area, may be generally positioned at a center of the eleventh pixel area PXA11, and may overlap the first sub-semiconductor pattern ACT_T1. The eleventh capacitor electrode C1_E1 may define the gate electrode of the first transistor T1.

The twenty-first capacitor electrode C2_E1 may have the specific area and may be positioned above the eleventh capacitor electrode C1_E1.

The gate pattern T2_GE of the second transistor T2 may extend in the first direction DR1, and overlap the channel region formed in the bent portion of the second sub-semiconductor pattern ACT_T2, to define respective gate electrodes of the (2_1)-th and (2_2)-th transistors T2_1 and T2_2.

The gate pattern T3_GE of the third transistor T3 may extend in the first direction DR1, may be branched in a second direction DR2, and may overlap the channel region formed in the bent portion of the third sub-semiconductor pattern ACT_T3, to define respective gate electrodes of the (3_1)-th and (3_2)-th transistors T3_1 and T3_2.

The gate pattern T4_GE of the fourth transistor T4 may extend in the first direction DR1, may be branched in the second direction DR2, and may overlap the channel region formed in the bent portion of the fourth sub-semiconductor pattern ACT_T4, to define respective gate electrodes of the (4_1)-th and (4_2)-th transistors T4_1 and T4_2.

The gate pattern T5_GE of the fifth transistor T5 may extend in the first direction DR1 and may overlap the channel region formed in the bent portion of the fifth sub-semiconductor pattern ACT_T5, to define respective gate electrodes of the (5_1)-th and (5_2)-th transistors T5_1 and T5_2.

The gate pattern T6_GE of the sixth transistor T6 may extend in the first direction DR1 and may overlap the channel region formed in the sixth sub-semiconductor region ACT_T2, to define a gate electrode of the sixth transistor T6.

The gate pattern T7_GE of the seventh transistor T7 may extend in the first direction DR1 and may overlap the channel region formed in the seventh sub-semiconductor pattern ACT_T7, to define a gate electrode of the seventh transistor T7.

The gate pattern T8_GE of the eighth transistor T8 and the gate pattern T9_GE of the ninth transistor T9 may be integrally formed and may extend in the first direction DR1. The gate pattern T8_GE of the eighth transistor T8 may overlap the channel region formed in the eighth sub-semiconductor pattern ACT_T8 to define a gate electrode of the eighth transistors T8, and the gate pattern T9_GE of the ninth transistor T9 may overlap the channel region formed in the channel region of the ninth sub-semiconductor pattern ACT_T9 to define a gate electrode of the ninth transistors T9.

The first conductive layer GAT1 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The first conductive layer GAT1 may have a single-layer or multi-layer structure, and for example, the first conductive layer GAT1 may have a single-layer structure including molybdenum (Mo).

Referring to FIGS. 6A to 6D, the second conductive layer GAT2 may include a twelfth capacitor electrode C1_E2, the (1_1)-th power source line VL_VDD, and the first to third shielding patterns SHP1, SHP2, and SHP3.

The (1_1)-th power source line VL_VDD may extend in the first direction DR1, may overlap the twenty-first capacitor electrode C2_E1, and may define the second capacitor C2 (refer to FIG. 2A) together with the twenty-first capacitor electrode C2_E1. The area of the (1_1)-th power source line VL_VDD may be greater than the area of the twenty-first capacitor electrode C2_E1 and may cover the twenty-first capacitor electrode C2_E1. The (1_1)-th power source line VL_VDD may include a first opening OP1 for connecting the second bridge pattern BRP2 (shown in FIG. 6E) formed of the third conductive layer SD1 and the twenty-first capacitor electrode C2_E1 formed of the first conductive layer GAT1.

The twelfth capacitor electrode C1_E2 may overlap the eleventh capacitor electrode C1_E1, and may define the first capacitor C1 (refer to FIG. 2A) together with the eleventh capacitor electrode C1_E1. The area of the twelfth capacitor electrode C1_E2 may be greater than the area of the eleventh capacitor electrode C1_E1 and may cover the eleventh capacitor electrode C1_E1. The twelfth capacitor electrode C1_E2 may include a second opening OP2 for connecting the fourth bridge pattern BRP4 (shown in FIG. 6E) formed of the third conductive layer SD1 and the eleventh capacitor electrode C1_E1 formed of the first conductive layer GAT1.

The first shielding pattern SHP1 may overlap the bent portion of the second sub-semiconductor pattern ACT_T2, and the second shielding pattern SHP2 may overlap the bent portion of the fifth sub-semiconductor pattern ACT_T5. At this time, the first and second shielding patterns SHP1 and SHP2 may be connected to the anode initialization power source line VL_aint through a contact hole, and may receive the anode initialization power source Vaint. Accordingly, leakage current of the second transistor T2 and the fifth transistor T5 may be minimized.

The third shielding pattern SHP3 may overlap the bent portion of the third and fourth sub-semiconductor regions ACT_T3 and ACT_T4. At this time, the third shielding pattern SHP3 may be connected to the (1_1)-th power source line VL_VDD through the third bridge pattern BRP3 and may receive the first power source VDD. Accordingly, leakage current of the third transistor T3 and the fourth transistor T4 may be minimized.

The second conductive layer GAT2 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The second conductive layer GAT2 may have a single-layer or multi-layer structure, and for example, the second conductive layer GAT2 may have a single-layer structure including molybdenum (Mo).

Referring to FIGS. 6A to 6E, the third conductive layer SD1 may include the first to fourth scan lines SL1, SL2, SL3, SL4, the first and second emission control lines EL1 and EL2, a (3_1)-th power source line VL_REF, a fourth power source line VL_int, a fifth power source line VL_aint, a sixth power source line VL_bs, and first to fifth bridge patterns BRP1 to BRP5.

The first scan line SL1 may extend in the first direction DR1. The first scan line SL1 may be connected to the gate pattern T2_GE of the second transistor T2 through a contact hole.

The second scan line SL2 may extend in the first direction DR1. The second scan line SL2 may be connected to the gate pattern T3_GE of the third transistor T3 through a contact hole, and may be connected to the gate pattern T5_GE of the fifth transistor T5 through the contact hole.

The third scan line SL3 may extend in the first direction DR1. The third scan line SL3 may be connected to the gate pattern T4_GE of the fourth transistor T4 through a contact hole.

The fourth scan line SL4 may extend in the first direction DR1. The fourth scan line SL4 may be connected to the gate patterns T8_GE and T9_GE of the eighth and ninth transistors T8 and T9, which are integrally formed, through a contact hole.

The first emission control line EL1 may extend in the first direction DR1. The first emission control line EL1 may be connected to the gate pattern T6_GE of the sixth transistor T6 through a contact hole.

The second emission control line EL2 may extend in the first direction DR1. The second emission control line EL2 may be connected to the gate pattern T7_GE of the seventh transistor T7 through a contact hole.

The (3_1)-th power source line VL_REF may extend in the first direction DR1. The (3_1)-th power source line VL_REF may be connected to one electrode of the fifth transistor T5 through a contact hole.

The fourth power source line VL_int may extend in the first direction DR1. The fourth power source line VL_int may be connected to one electrode of the fourth transistor T4 through a contact hole.

The fifth power source line VL_aint may extend in the first direction DR1. The fifth power source line VL_aint may be connected to one electrode of the eighth transistor T8 through a contact hole. The fifth power source line VL_aint may be connected to the first shielding pattern SHP1 and the second shielding pattern SHP2 through a contact hole.

The sixth power source line VL_bs may extend in the first direction DR1. The sixth power source line VL_bs may be connected to one electrode of the ninth transistor T9 through a contact hole.

The first bridge pattern BRP1 may overlap one electrode of the second transistor T2 and may be connected to one electrode of the second transistor T2 through a contact hole. In addition, the first bridge pattern BRP1 may be connected to the data line DL formed of the fourth conductive layer SD2 through a contact hole. That is, the first bridge pattern BRP1 may connect the one electrode of the second transistor T2 and the data line DL.

The second bridge pattern BRP2 may extend in the second direction DR2 and may overlap each of a portion of the first semiconductor pattern ACT1, the twelfth capacitor electrode C1_E2, and the twenty-first capacitor electrode C2_E1. The second bridge pattern BRP2 may be connected to a portion of the first semiconductor pattern ACT1 through a contact hole, and may be connected to each of one electrode of the second transistor T2 and one electrode of the fifth transistor T5. In addition, the second bridge pattern BRP2 may be connected to the twelfth capacitor electrode C1_E2 through a contact hole. In addition, the second bridge pattern BRP2 may be connected to the twenty-first capacitor electrode C2_E1 exposed by the first opening OP1 formed in the (1_1)-th power source line VL_VDD. That is, the second bridge pattern BRP2 may define the third node N3 of FIG. 2A.

The third bridge pattern BRP3 may overlap each of the (1_1)-th power source line VL_VDD, one electrode of the sixth transistor T6, and the third shielding pattern SHP3. The third bridge pattern BRP3 may overlap each of the (1_1)-th power source line VL_VDD, the one electrode of the sixth transistor T6, and the third shielding pattern SHP3 through a contact hole.

The third bridge pattern BRP3 may have an 'H' shape. In other words, the third bridge pattern BRP3 may include a horizontal portion BRP3_1 extending in the first direction DR1, and a first vertical portion BRP3_2 and a second vertical portion BRP3_3 disposed at both ends of the horizontal portion BRP3_1 and extending in the second direction DR2. At this time, the horizontal portion BRP3_1 may overlap the twelfth capacitor electrode C1_E2 in the third direction DR3. Each of the first and second vertical portions BRP3_2 and BRP3_3 may be spaced apart from the twelfth capacitor electrode C1_E2 by a preset distance on a plane. For example, the preset distance may be about 1.5 μm.

Since the third bridge pattern BRP3 is for connecting the (1_1)-th power source line VL_VDD to one electrode of the sixth transistor T6 and the third shielding pattern SHP3, only the first vertical portion BRP3_2 may perform a function. However, when the separation distance between the third bridge pattern BRP3 (or the first vertical portion BRP3_1) and the twelfth capacitor electrode C1_E2 is changed due to differences in manufacturing processes, the capacitance between the third bridge pattern BRP3 (or the first vertical portion BRP3_1) and the twelfth capacitor electrode C1_E2 may vary. The capacitance between the third bridge pattern BRP3 (or the first vertical portion BRP3_1) and the twelfth capacitor electrode C1_E2 may correspond to the (2_1)-th capacitor C2_1 (refer to FIG. 2B). Therefore, when the capacitance between the third bridge pattern BRP3 (or the first vertical part BRP3_1) and the twelfth capacitor electrode C1_E2 is changed, the ratio of the first capacitor C1 and the second capacitor C2 may be changed. In general, it is preferable to maintain a ratio of about 1:1 between the first capacitor C1 and the second capacitor C2 for a series conversion maximum capacitance. Therefore, the horizontal portion BRP3_1 having the predetermined area and the twelfth capacitor electrode C1_E2 may be designed intentionally so as to overlap in the third direction DR3, and thus the capacitance formed between the horizontal portion BRP3_1 and the twelfth capacitor electrode C1_E2 may be maintained. In addition, in consideration of the differences in manufacturing processes, each of the first and second vertical portions BRP3_2 and BRP3_3 may be spaced apart from the twelfth capacitor electrode C1_E2 by a preset distance when viewed in plan, and thus a capacitance may be prevented from being generated between the first and second vertical portions BRP3_2 and BRP3_3 and the twelfth capacitor electrodes C1_E2.

The capacitance between the eleventh capacitor electrode C1_E1 and the twelfth capacitor electrode C1_E2 (or the capacitance of the first capacitor C1) may be equal to a sum of a capacitance between the twenty-first capacitor electrode C2_E1 and the (1_1)-th power source line VL_VDD (or the capacitance of the second capacitor C2) and a capacitance between the third bridge pattern BRP3 (or the first vertical portion BRP3_1) and the twelfth capacitor electrode C1_E2 (or a capacitance of the (2_1)-th capacitor C2_1). Accordingly, the capacitance ratio of the first capacitor C1 and the second capacitor C2 (including the (2_1)-th capacitor C2_1)

may be substantially constantly maintained at 1:1 regardless of differences in manufacturing processes.

In addition, each of the first and second vertical portions BRP3_2 and BRP3_3 to which the first power source VDD is supplied may shield the adjacent data line DL and first capacitor C1 (or the twelfth capacitor electrode C1_E2), and thus crosstalk generation may be minimized.

The fourth bridge pattern BRP4 may connect one electrode of the first transistor T1 (or the eleventh capacitor electrode C1_E1) and one electrode of the third transistor T3. The fourth bridge pattern BRP4 may be connected to the eleventh capacitor electrode C1_E1 exposed by the second opening OP2 formed in the twelfth capacitor electrode C1_E2. In addition, the fourth bridge pattern BRP4 may be connected to one region of the third sub-semiconductor region ACT3_T3 through a contact hole.

The fifth bridge pattern BRP5 may connect one electrode of the seventh transistor T7 and the anode of the light emitting element LD.

Referring to FIGS. 6A to 6F, the fourth conductive layer SD2 may include a sixth bridge pattern BRP6, the data line DL, a first power source line VDDL, and a third power source line VREFL.

The sixth bridge pattern BRP6 may overlap the fifth bridge pattern BRP5 and may be connected to the fifth bridge pattern BRP5 through a contact hole. The sixth bridge pattern BRP6 may be connected to one electrode of the seventh transistor T7 through the fifth bridge pattern BRP5. In addition, the sixth bridge pattern BRP6 may be connected to the anode of the light emitting element LD through a contact hole (not shown). That is, the sixth bridge pattern BRP6 may connect the one electrode of the seventh transistor T7 to the anode of the light emitting element LD together with the fifth bridge pattern BRP5.

The data line DL may extend in the second direction DR2, may be positioned on a left side of the eleventh pixel area PXA11 in the first direction DR1, and may overlap the first bridge pattern BRP1. The data line DL may be connected to the first bridge pattern BRP1 through a contact hole, and may be connected to one electrode of the second transistor T2 through the first bridge pattern BRP1.

The third power source line VREFL may extend in the second direction DR2, may be positioned on a right side of the eleventh pixel area PXA11 in the first direction DR1, and may overlap the (3_1)-th power source line VL_REF. The third power source line VREFL may be connected to the (3_1)-th power source line VL_REF through a contact hole, and may be connected to one electrode of the fifth transistor T5 through a contact hole.

The first power source line VDDL may extend in the second direction DR2 and may be positioned between the data line DL and the third power source line VREFL. The first power source line VDDL may be connected to the third bridge pattern BRP3 (or an upper side of the first vertical portion BRP3_2) through a contact hole.

As described above, the first power source line VDDL may extend in the second direction DR2, and the (1_1)-th power source line VL_VDD connected to the first power source line VDDL through the third bridge pattern BRP3 and a contact hole may extend in the first direction DR1 and thus may have a mesh structure. In addition, the third power source line VREFL may extend in the second direction DR2, and the (3_1)-th power source line VL_REF connected to the third power source line VREFL through a contact hole may extend in the first direction DR1 and thus may have a mesh structure. Accordingly, IR drop may be reduced, and stain distribution of the display panel 100 may be reduced.

The third conductive layer SD1 and the fourth conductive layer SD2 may include one or more metals selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu). The third conductive layer SD1 and the fourth conductive layer SD2 may have a single-layer or multi-layer structure, and for example, the third conductive layer SD1 and the fourth conductive layer SD2 may have a multi-layer structure of Ti/AL/Ti.

Figure 7:
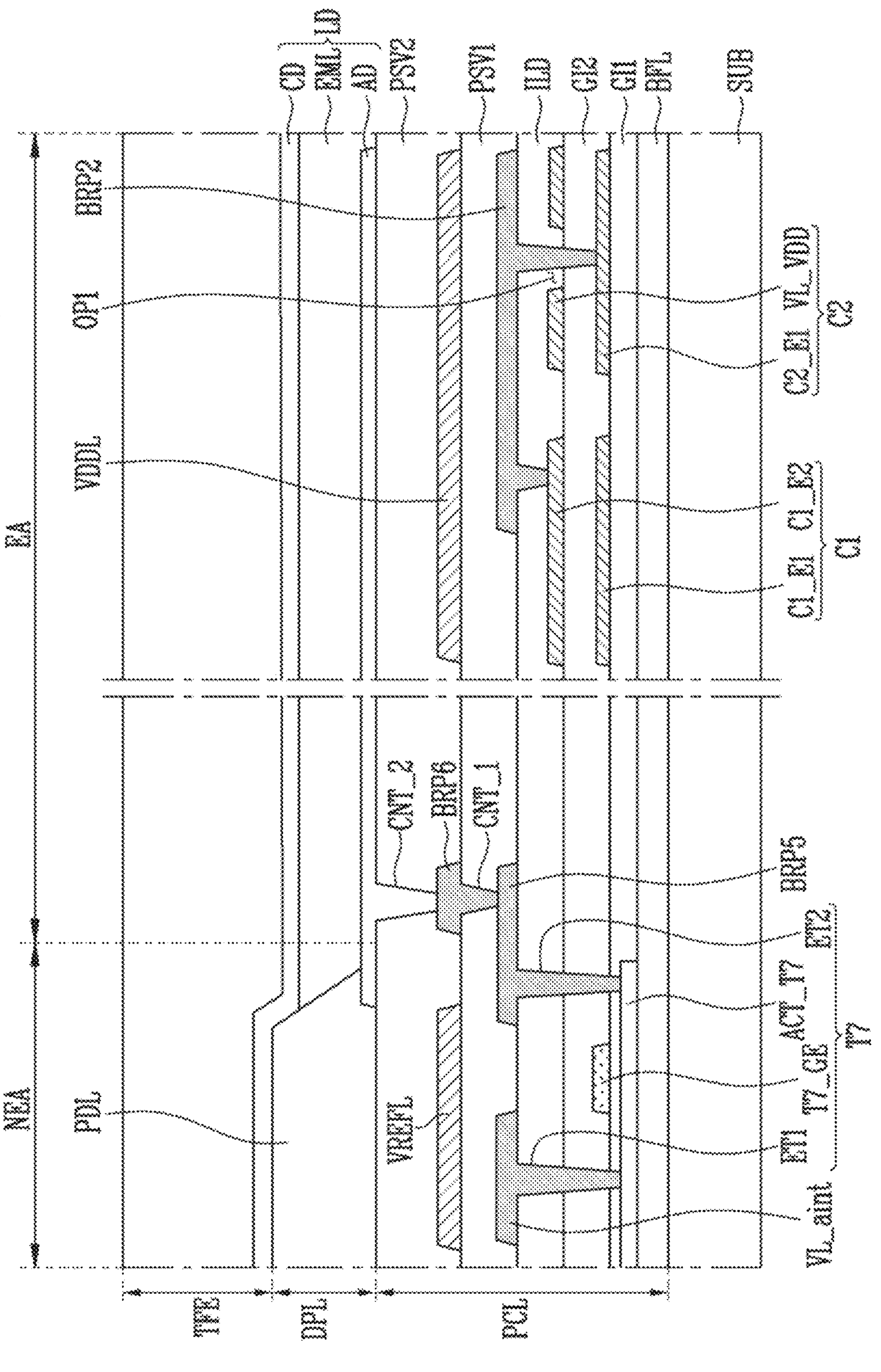
FIG. 7 is a partial cross-sectional view of a portion of the pixels of FIG. 6A.

FIG. 7 is a partial cross-sectional view of a portion of the pixels of FIG. 6A. FIGS. 8 to 10C are enlarged cross-sectional views of embodiments of an emission layer of a display device constructed according to the principles of the invention.

Referring to FIGS. 2A, 6A, and 7, since the eleventh to thirteenth pixels PX11 to PX13 (or light emitting units of the eleventh to thirteenth pixels PX11 to PX13) are substantially the same as or similar to each other, hereinafter, the description of eleventh pixel PX11 is applicable to each of the eleventh to thirteenth pixels PX11 to PX13.

In FIG. 7, one pixel is shown in a simplified manner, such as showing an electrode as an electrode of a single layer and a plurality of insulating layers as only an insulating layer of a single layer, but the embodiments are not limited thereto.

In addition, in an embodiment, unless otherwise specified, "formed and/or provided on the same layer" may mean formed in the same process, and "formed and/or provided on different layers" may mean formed in different processes.

A pixel circuit layer PCL, a display element layer DPL, and a thin film encapsulation layer TFE may be sequentially disposed on a base layer SUB (or substrate).

The pixel circuit layer PCL may include a buffer layer BFL, a semiconductor layer ACT, a first insulating layer GI1 (or a first gate insulating layer), the first conductive layer GAT1, a second insulating layer GI2 (or a second gate insulating layer), the second conductive layer GAT2, a third insulating layer ILD (or an interlayer insulating layer), the third conductive layer SD1, a first protective layer PSV1 (a first via layer, or a fourth insulating layer), the fourth conductive layer SD2, and a second protective layer PSV2 (a second via layer, or a fifth insulating layer).

The buffer layer BFL, the semiconductor layer ACT, the first insulating layer GI1, the first conductive layer GAT1, the second insulating layer GI2, the second conductive layer GAT2, the third insulating layer ILD, the third conductive layer SD1, the first protective layer PSV1, the fourth conductive layer SD2, and the second protective layer PSV2 may be sequentially stacked on the base layer SUB. Since the semiconductor layer ACT, the first conductive layer GAT1, the second conductive layer GAT2, the third conductive layer SD1, and the fourth conductive layer SD2 are described with reference to FIG. 6A, a repetitive description is omitted.

The base layer SUB may be formed of an insulating material such as glass or resin. In addition, the base layer SUB may be formed of a material having flexibility to be bent or folded, and may have a single-layer structure or a multi-layer structure. For example, the material having flexibility may include at least one among polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate. However, the material configuring the base layer SUB is not limited to the above-described embodiments.

The buffer layer BFL may be disposed on the entire surface of the base layer SUB. The buffer layer BFL may prevent diffusion of an impurity ion and may prevent penetration of moisture or external air. The buffer layer BFL may be an inorganic insulating layer including an inorganic material. The inorganic insulating layer may include, for example, at least one of a metal oxide such as silicon nitride (SiNx), silicon oxide (SiOx), silicon oxynitride (SiON), and aluminum oxide (AlOx). The buffer layer BFL may be provided as a single layer, or may be provided as a multi-layer of at least a double layer. When the buffer layer BFL is provided as a multilayer, each layer may be formed of the same material or different materials. The buffer layer BFL may be omitted according to the material and a process condition of the base layer SUB.

The semiconductor layer ACT may be disposed on the buffer layer BFL. The semiconductor layer ACT may be disposed between the buffer layer BFL and the first insulating layer GI1. The semiconductor layer ACT may include the seventh sub-semiconductor pattern ACT_T7 configuring the seventh transistor T7. The seventh sub-semiconductor pattern ACT_T7 may include a first region contacting a first transistor electrode ET1, a second region contacting a second transistor electrode ET2, and a channel region positioned between the first and second regions. The seventh sub-semiconductor pattern ACT_T7 of the seventh transistor T7 may be a semiconductor pattern formed of amorphous silicon, polysilicon, low-temperature polysilicon, or the like. However, the embodiments are not limited thereto, and the seventh sub-semiconductor pattern ACT_T7 of the seventh transistor T7 may be a semiconductor pattern including an oxide semiconductor. The channel region may be, for example, a semiconductor pattern that is not doped with an impurity, and may be an intrinsic semiconductor. The first region and the second region may be semiconductor patterns doped with impurities.

The first insulating layer GI1 may be disposed on the semiconductor layer ACT. The first insulating layer GI1 may be an inorganic insulating layer including an inorganic material. For example, the first insulating layer GI1 may include the same material as the buffer layer BFL, or may include one or more materials selected from the materials exemplified as the configuration material of the buffer layer BFL. According to an embodiment, the first insulating layer GI1 may be formed of an organic insulating layer including an organic material. The first insulating layer GI1 may be provided as a single layer, but may be provided as a multilayer of at least a double layer.

The first conductive layer GAT1 may be disposed on the first insulating layer GI1. As described with reference to FIG. 6A, the first conductive layer GAT1 may include the gate pattern T7_GE of the seventh transistor T7, the eleventh capacitor electrode C1_E11, and the twenty-first capacitor electrode C2_E21.

The second insulating layer GI2 may be disposed on the first insulating layer GI1 and the first conductive layer GAT1. The second insulating layer GI2 may be generally disposed over the entire surface of the base layer SUB. The second insulating layer GI2 may include the same material as the first insulating layer GI1 or may include one or more materials selected from the materials exemplified as the configuration material of the first insulating layer GI1.

The second conductive layer GAT2 may be disposed on the second insulating layer GI2. As described with reference to FIG. 6A, the second conductive layer GAT2 may include the twelfth capacitor electrode C1_E12 and the (1_1)-th power source line VL_VDD. The twelfth capacitor electrode C1_E12 may overlap the eleventh capacitor electrode C1_E11, and may define the first capacitor C1 together with the eleventh capacitor electrode C1_E11. The (1_1)-th power source line VL_VDD may overlap the twenty-first capacitor electrode C2_E21, and may define the second capacitor C2 together with the twenty-first capacitor electrode C2_E21. The (1_1)-th power source line VL_VDD may include the first opening OP1.

The third insulating layer ILD may be disposed on the second insulating layer GI2 and the second conductive layer GAT2. The third insulating layer ILD may be generally disposed over substantially the entire surface of the base layer SUB.

The third insulating layer ILD may include an inorganic insulating material such as a silicon compound or a metal oxide. For example, the first insulating layer GI1 may include silicon oxide, silicon nitride, silicon oxynitride, aluminum oxide, tantalum oxide, hafnium oxide, zirconium oxide, titanium oxide, or a combination thereof. The third insulating layer ILD may be a single layer or a multilayer formed of a stack layer of different materials.

The third conductive layer SD1 may be disposed on the third insulating layer ILD. As described with reference to FIG. 6A, the third conductive layer SD1 may include the second bridge pattern BRP2, the fifth bridge pattern BRP5, and the fifth power source line VL_aint.

The fifth power source line VL_aint may overlap one region of the seventh sub-semiconductor pattern ACT_T7, may be connected to one region of the seventh sub-semiconductor pattern ACT_T7 through a contact hole passing through the first insulating layer GI1, the second insulating layer GI2, and the third insulating layer ILD, and may define the first transistor electrode ET1 of the seventh transistor T7.

The fifth bridge pattern BRP5 may overlap another region of the seventh sub-semiconductor pattern ACT_T7, may be connected to another region of the seventh sub-semiconductor pattern ACT_T7 through a contact hole passing through the first insulating layer GI1, the second insulating layer GI2, and the third insulating layer ILD, and may define the second transistor electrode ET2 of the seventh transistor T7.

The second bridge pattern BRP2 may be connected to the twelfth capacitor electrode C1_E12 through a contact hole. The second bridge pattern BRP2 may be connected to the twenty-first capacitor electrode C2_E21 through a contact hole formed in the first opening OP1. The second bridge pattern BRP2 may define the third node N3 of FIG. 2A.

The first protective layer PSV1 may be disposed on the third insulating layer ILD and the third conductive layer SD1. The first protective layer PSV1 may be generally disposed over the entire surface of the base layer SUB.

The first protective layer PSV1 may include an organic insulating material such as polyacrylates resin, epoxy resin, phenolic resin, polyamides resin, polyimides rein, unsaturated polyester resin, polyphenyleneethers resin, polyphenylenesulfides resin, or benzocyclobutene (BCB).

The fourth conductive layer SD2 may be disposed on the first protective layer PSV1. As described with reference to FIG. 6A, the fourth conductive layer SD2 may include the sixth bridge pattern BRP6, the first power source line VDDL, and the third power source line VREFL.

The sixth bridge pattern BRP6 may overlap the fifth bridge pattern BRP5 and may be connected to the fifth bridge pattern BRP5 through a contact hole CNT_1 passing through the first protective layer PSV1.

The third power source line VREFL may overlap a partial region of the fifth power source line VL_aint.

The first power source line VDDL may overlap the first capacitor C1 and the second capacitor C2.

The second protective layer PSV2 may be disposed on the first protective layer PSV1 and the fourth conductive layer SD2. The second protective layer PSV2 may be generally disposed over the entire surface of the base layer SUB. The second protective layer PSV2 may include the same material as the first protective layer PSV1 or may include one or more materials selected from the materials exemplified as the configuration material of the first protective layer PSV1.

The display element layer DPL may be provided on the second protective layer PSV2.

The display element layer DPL may include an anode AD, a pixel defining layer PDL, an emission layer EML, and a cathode CD. The anode AD, the pixel defining layer PDL, the emission layer EML, and the cathode CD may be sequentially disposed or formed on the second protective layer PSV2 (or the pixel circuit layer PCL).

The anode AD may be disposed on the second protective layer PSV2. The anode AD may correspond to an emission area EA of each pixel.

The anode AD may be connected to the sixth bridge pattern BRP6 through a contact hole CNT_2 passing through the second protective layer PSV2 and exposing the sixth bridge pattern BRP6. The anode AD may be connected to the second transistor electrode ET2 of the seventh transistor T7 through the sixth bridge pattern BRP6 and the fifth bridge pattern BRP5.

The anode AD may be formed of a conductive material (or substance) having a substantially constant reflectance. The conductive material (or substance) may include an opaque metal. The opaque metal may include, for example, a metal such as silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), and an alloy thereof. According to an embodiment, the anode AD may include a transparent conductive material (or substance). The transparent conductive material (or substance) may include a conductive oxide such as indium tin oxide (ITO), indium zinc oxide (IZO), zinc oxide (ZnO), indium gallium zinc oxide, IGZO), or indium tin zinc oxide (ITZO), and a conductive polymer such as poly(3,4-ethylenedioxythiophene) (PEDOT).

The pixel defining layer PDL may be disposed or formed on the second protective layer PSV2 and the anode AD in a non-emission area NEA. The pixel defining layer PDL may partially overlap an edge of the anode AD in the non-emission area NEA. The pixel defining layer PDL may include an insulating material including an inorganic material and/or an organic material. For example, the pixel defining layer PDL may include an inorganic layer of at least one layer including various currently known inorganic insulating materials including silicon nitride (SiNx) or silicon oxide (SiOx). Alternatively, the pixel defining layer PDL may include an organic layer, a photoresist layer, and/or the like of at least one layer including various currently known organic insulating materials, or may be defined as an insulator of a single layer or multiple layers by including organic/inorganic materials in combination. That is, the configuration material of the pixel defining layer PDL may be variously changed.

In an embodiment, the pixel defining layer PDL may include at least one light blocking material and/or a reflective material to prevent a light leakage defect in which light (or rays) leaks between pixels. According to an embodiment, the pixel defining layer PDL may include a transparent material (or substance). The transparent material may include, for example, polyamides resin, polyimides resin, and the like, but the embodiments are not limited thereto. According to another embodiment, a reflective material layer may be separately provided and/or formed on the pixel defining layer PDL to further improve efficiency of light emitted from each pixel.

The emission layer EML may be disposed on the anode AD in the emission area EA. That is, the emission layer EML may be formed separately in each of the plurality of pixels PX. The emission layer EML may include an organic material and/or an inorganic material to emit light of a predetermined color. For example, the pixel PX may include first to third sub-pixels. Each of the first to third sub-pixels may emit red light, green light, and blue light. However, the embodiments are not limited thereto, and for example, the emission layer EML may be commonly disposed in the plurality of pixels PX. At this time, the emission layer EML may emit white light.

Figure 8:
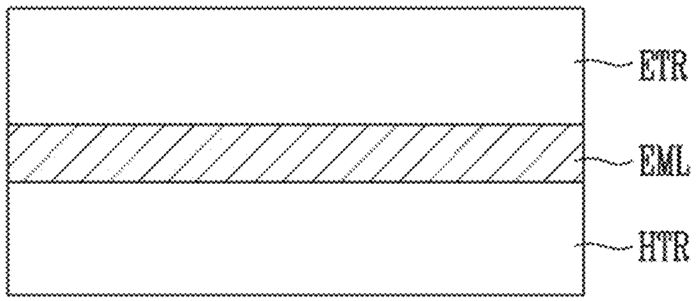
FIGS. 8 to 10C are enlarged cross-sectional views of embodiments of an emission layer of a display device constructed according to the principles of the invention.
Figure 9:
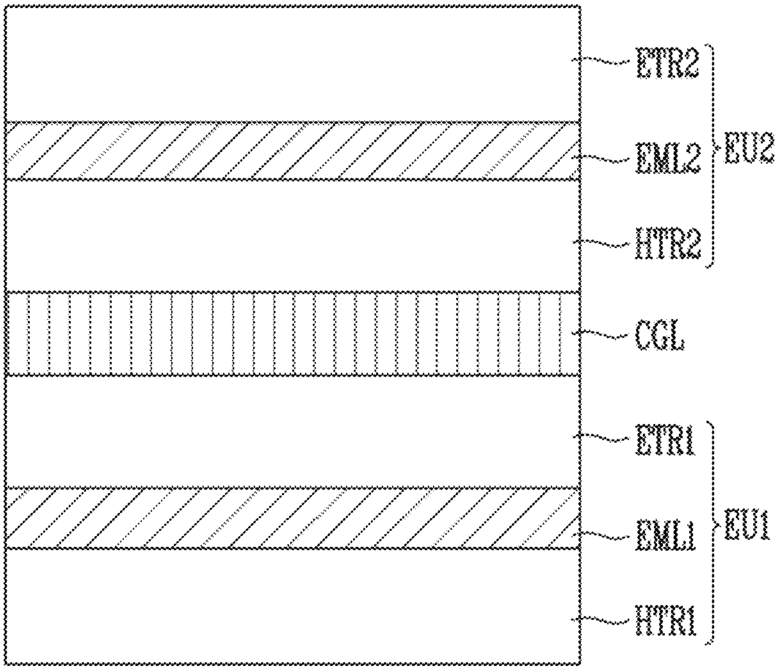

The emission layer EML may have a single emission structure, a two-stack tandem emission structure, and a three-stack tandem emission structure. Hereinafter, it is assumed that an emission structure of FIGS. 8 to 10 is identically applied to all pixels PXL included in the display panel 100. That is, all pixels PXL included in the display panel 100 may emit light of substantially the same color. In this case, a color filter may be further included on the display element layer DPL shown in FIG. 7. The color filter may include a color filter material that selectively transmits light of a specific color converted by color changing particles. When the pixel is a red pixel, the color filter may include a red color filter. In addition, when the pixel is a green pixel, the color filter may include a green color filter. In addition, when the pixel is a blue pixel, the color filter may include a blue color filter.

Referring to FIGS. 7 and 8, the single emission structure may include the emission layer EML, an electron transport region ETR, and a hole transport region HTR. The emission layer EML may be disposed between the electron transport region ETR and the hole transport region HTR. According to an embodiment, the electron transport region ETR may be electrically connected to the cathode CD of the light emitting element LD, and the hole transport region ETR may be electrically connected to the anode AD of the light emitting element LD.

Referring to FIGS. 7 and 9, a two-stack tandem emission structure according to an embodiment may include a plurality of emission structure units. For example, the two-stack tandem emission structure may include a first emission structure unit EU1 adjacent to the anode AD of the light emitting element LD and a second emission structure unit EU2 adjacent to the cathode CD.

Each of the first and second emission structure units EU1 and EU2 includes an emission layer that generates light according to an applied current. For example, the first emission structure unit EU1 may include a first emission layer EML1, a first electron transport region ETR1, and a first hole transport region HTR1. The first emission layer EML1 may be disposed between the first electron transport region ETR1 and the first hole transport region HTR1. For example, the second emission structure unit EU2 may include a second emission layer EML2, a second electron transport region ETR2, and a second hole transport region HTR2. The second emission layer EML2 may be disposed between the second electron transport region ETR2 and the second hole transport region HTR2.

Each of the first hole transport region HTR1 and the second hole transport region HTR2 may include at least one of a hole injection layer and a hole transport layer, and may further include a hole buffer layer, an electron blocking layer, and the like as necessary. The first hole transport region HTR1 and the second hole transport region HTR2 may have the same configuration or different configurations.

Each of the first electron transport region ETR1 and the second electron transport region ETR2 may include at least one of an electron injection layer and an electron transport layer, and may further include an electron buffer layer, a hole blocking layer, and the like as necessary. The first electron transport region ETR1 and the second electron transport region ETR2 may have the same configuration or different configurations.

A connection layer CGL may be disposed between the first emission structure unit EU1 and the second emission structure unit EU2.

For example, the connection layer CGL may have a stack structure of a p dopant layer and an n dopant layer. For example, the p dopant layer may include a p-type dopant such as HAT-CN, TCNQ, and NDP-9, and the n dopant layer may include an alkali metal, an alkaline earth metal, a lanthanide-based metal, or a combination thereof. According to an embodiment, the first emission layer EML1 and the second emission layer EML2 may generate light of the same color.

According to an embodiment, the first emission layer EML1 may generate light of a color different from that of the second emission layer EML2. According to an embodiment, the light emitted from each of the first emission layer EML1 and the second emission layer EML2 may be mixed to generate white light. For example, the first emission layer EML1 may generate blue light, and the second emission layer EML2 may generate yellow light.

The cathode CD may be disposed on the emission layer EML. The cathode CD may be commonly disposed in the plurality of pixels PX.

The thin film encapsulation layer TFE may be disposed on the cathode CD. The thin film encapsulation layer TFE may be commonly disposed in the plurality of pixels PX. In FIG. 7, the thin film encapsulation layer TFE directly covers the cathode CD, but a capping layer CPL (refer to FIG. 11) covering the cathode CD may be further disposed between the thin film encapsulation layer TFE and the cathode CD.

Figure 10A:
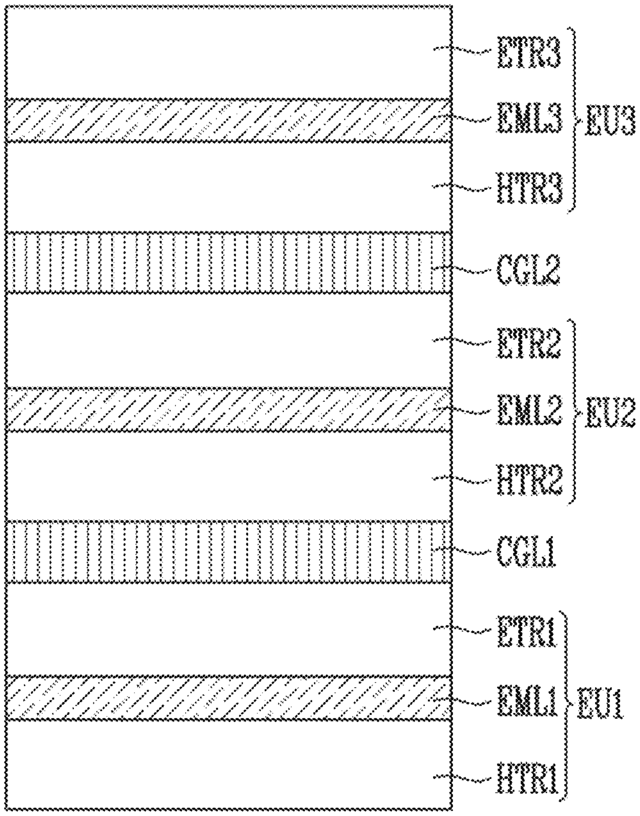

Referring to FIGS. 7 and 10A, the three-stack tandem emission structure may include three or more emission structure units.

For example, as shown in FIG. 10A, the three-stack tandem emission structure may include a first emission structure unit EU1, a second emission structure unit EU2, and a third emission structure unit EU3.

The three-stack tandem emission structure includes an emission layer that each generate light according to an applied current. For example, the first emission structure unit EU1 may include a first emission layer EML1, a first electron transport region ETR1, and a first hole transport region HTR1. The first emission layer EML1 may be disposed between the first electron transport region ETR1 and the first hole transport region HTR1. The second emission structure unit EU2 may include a second emission layer EML2, a second electron transport region ETR2, and a second hole transport region HTR2. The second emission layer EML2 may be disposed between the second electron transport region ETR2 and the second hole transport region HTR2. The third emission structure unit EU3 may include a third emission layer EML3, a third electron transport region ETR3, and a third hole transport region HTR3. The third emission layer EML3 may be disposed between the third electron transport region ETR3 and the third hole transport region HTR3.

Each of the first hole transport region HTR1, the second hole transport region HTR2, and the third hole transport region HTR3 may include at least one of a hole injection layer and a hole transport layer, and may further include a hole buffer layer, an electron blocking layer, and the like as necessary. The first hole transport region HTR1, the second hole transport region HTR2, and the third hole transport region HTR3 may have the same configuration or different configurations.

Each of the first electron transport region ETR1, the second electron transport region ETR2, and the third electron transport region ETR3 may include at least one of an electron injection layer and an electron transport layer, and may further include an electron buffer layer, a hole blocking layer, and the like as necessary. The first electron transport region ETR1, the second electron transport region ETR2, and the third electron transport region ETR3 may have the same configuration or different configurations.

A first connection layer CGL1 may be disposed between the first emission structure unit EU1 and the second emission structure unit EU2. A second connection layer CGL2 may be disposed between the second emission structure unit EU2 and the third emission structure unit EU3.

According to an embodiment, the first emission layer EML1 and the third emission layer EML3 may generate light of a color different from that of light of the second emission layer EML2. According to an embodiment, the light emitted from each of the first to third emission layers EML1 to EML3 may be mixed to generate white light. For example, the first emission layer EML1 and the third emission layer EML3 may generate blue light, and the second emission layer EML2 may generate yellow light.

Figure 10B:
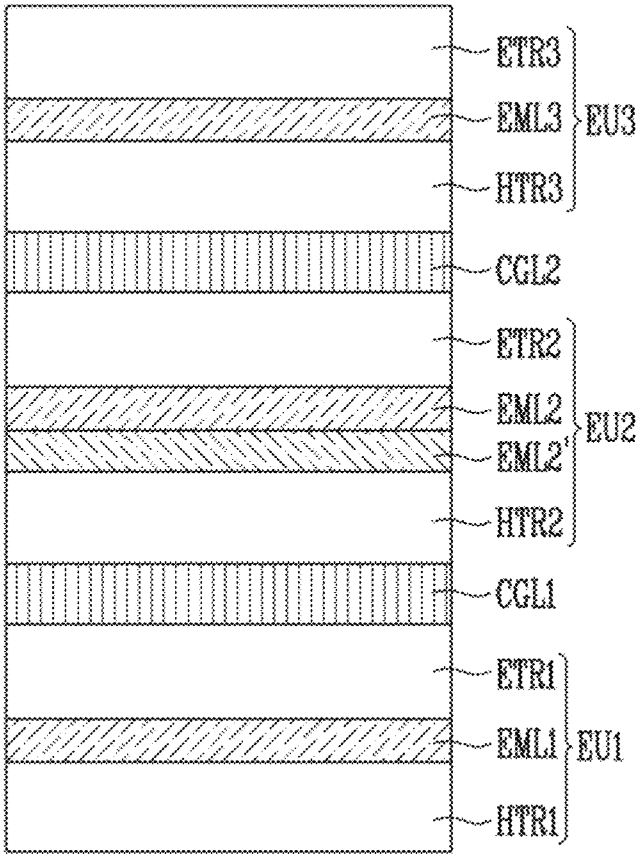
Figure 10C:
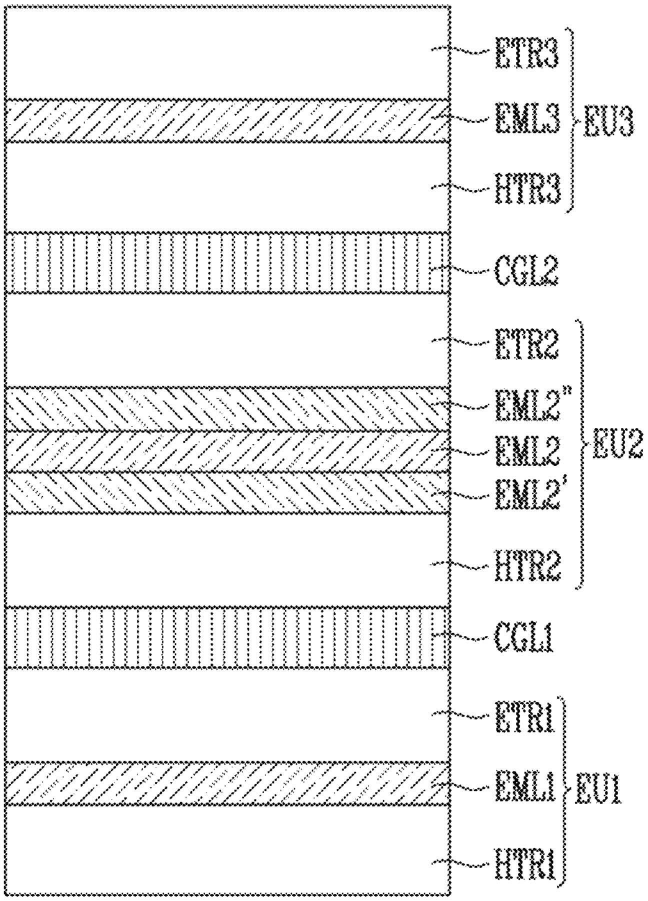

However, the embodiments are not limited thereto, and the second emission layer EML2 may further include sub-emission layers EML2' and EML2" to improve purity. For example, as shown in FIG. 10B, the second emission layer EML2 may include a (2-1)-th sub-emission layer EML2' disposed at a lower portion. At this time, the (2-1)-th sub-emission layer EML2' may generate red light. In addition, as shown in FIG. 10C, the second emission layer EML2 may include a (2-1)-th sub-emission layer EML2' disposed at a lower portion and a (2-2)-th sub-emission layer EML2" disposed at an upper portion. At this time, the (2-1)-th sub-emission layer EML2' may generate red light, and the (2-2)-th sub-emission layer EML2" may generate green light.

The single emission structure, the two-stack tandem emission structure, and the three-stack tandem emission structure may be formed by vacuum deposition, inkjet printing, or the like.

Figure 11:
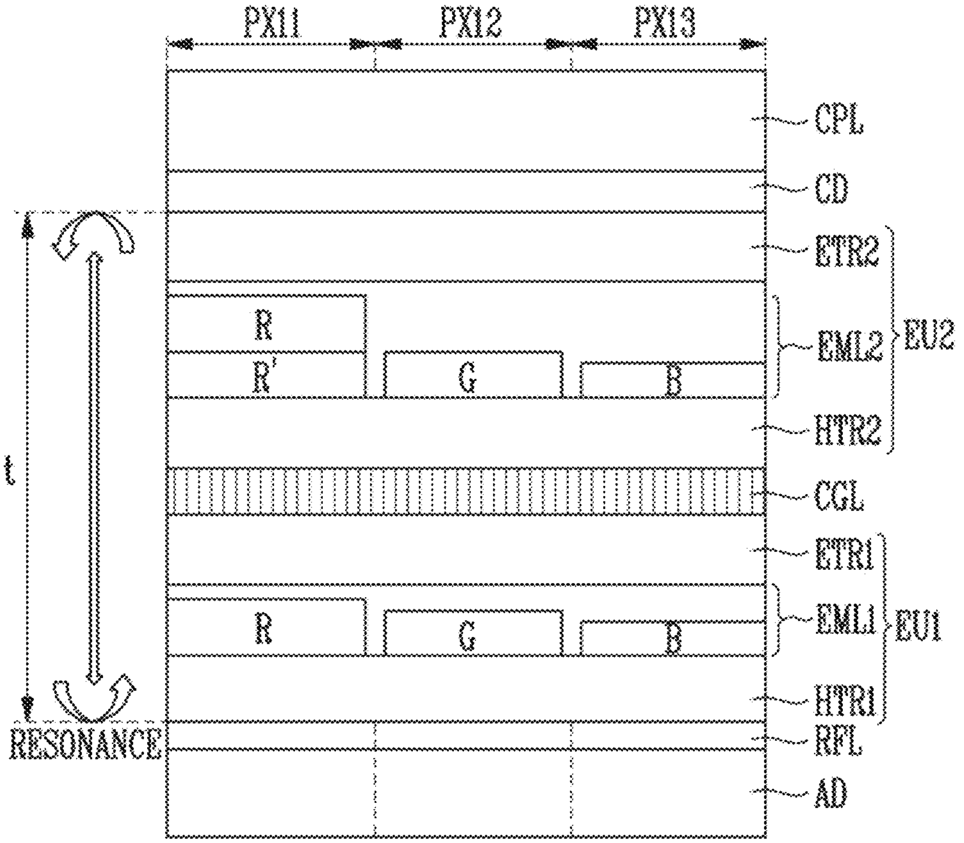
FIG. 11 is a schematic diagram of an embodiment of a two-stack tandem emission structure of the emission layer constructed according to the principles of the invention.

FIG. 11 is a schematic diagram of an embodiment of a two-stack tandem emission structure of the emission layer constructed according to the principles of the invention. At this time, FIG. 11 is a schematic cross-sectional view of one unit pixel shown in FIG. 6A, that is, the eleventh pixel PX11, the twelfth pixel PX12, and the thirteenth pixel PX13. Hereinafter, for convenience of description, the embodiment is described under premise that the eleventh pixel PX11 includes a red emission layer R, the twelfth pixel PX12 includes a green emission layer G, and the thirteenth pixel PX13 includes a blue emission layer B.

Referring to FIG. 11, a two-stack tandem emission structure according to another embodiment may include a plurality of emission structure units. For example, the two-stack tandem emission structure may include a first emission structure unit EU1 adjacent to the anode AD of the light emitting element LD and a second emission structure unit EU2 adjacent to the cathode CD.

Each of the first and second emission structure units EU1 and EU2 includes an emission layer that generates light according to an applied current. For example, the first emission structure unit EU1 may include a first emission layer EML1, a first electron transport region ETR1, and a first hole transport region HTR1. The first emission layer EML1 may be disposed between the first electron transport region ETR1 and the first hole transport region HTR1. For example, the second emission structure unit EU2 may include a second emission layer EML2, a second electron transport region ETR2, and a second hole transport region HTR2. The second emission layer EML2 may be disposed between the second electron transport region ETR2 and the second hole transport region HTR2.

Each of the first hole transport region HTR1 and the second hole transport region HTR2 may include at least one of a hole injection layer and a hole transport layer, and may further include a hole buffer layer, an electron blocking layer, and the like as necessary. The first hole transport region HTR1 and the second hole transport region HTR2 may have the same configuration or different configurations.

Each of the first electron transport region ETR1 and the second electron transport region ETR2 may include at least one of an electron injection layer and an electron transport layer, and may further include an electron buffer layer, a hole blocking layer, and the like as necessary. The first electron transport region ETR1 and the second electron transport region ETR2 may have the same configuration or different configurations.

A connection layer CGL may be disposed between the first emission structure unit EU1 and the second emission structure unit EU2.

For example, the connection layer CGL may have a stack-structure of a p dopant layer and an n dopant layer. For example, the p dopant layer may include a p-type dopant such as HAT-CN, TCNQ, and NDP-9, and the n dopant layer may include an alkali metal, an alkaline earth metal, a lanthanide-based metal, or a combination thereof. According to an embodiment, the first emission layer EML1 and the second emission layer EML2 may generate light of the same color.

In the eleventh pixel PX11, the twelfth pixel PX12, and the thirteenth pixel PX13 shown in FIG. 11, the anode AD, an emission auxiliary layer R', the red emission layer R, the green emission layer G, and the blue emission layer B may be formed separately for each of the eleventh pixel PX11, the twelfth pixel PX12, and the thirteenth pixel PX13, and the first electron transport region ETR1, the second electron transport region ETR2, the first hole transport region HTR1, the second hole transport region HTR2, the connection layer CGL, and the cathode CD may be commonly stacked with respect to the eleventh pixel PX11, the twelfth pixel PX12, and the thirteenth pixel PX13.

A reflective layer RFL may be included between the anode AD and the first hole transport region HTR1. The reflective layer RFL may be a transparent conductive layer. The transparent conductive layer may include a transparent conductive oxide (TCO), and may include at least one of indium tin oxide (ITO), indium zinc oxide (IZO), zinc oxide (ZnO), aluminum zinc oxide (AZO), and indium oxide (In2O3). The transparent conductive layer has a relatively high work function. When the anode AD includes a transparent conductive layer, hole injection through the anode AD may be facilitated.

The cathode CD may be formed of a semi-transmissive layer including a metal. A capping layer CPL covering the cathode CD may be further disposed on the cathode CD. The capping layer CPL may serve to protect the emission layers EML1 and EML2 and to help light generated from the emission layers EML1 and EML2 to be efficiently emitted to outside of the panel. A buffer layer and a metal layer may be further included between the second emission layer EML2 and the cathode CD.

A fine resonance structure may be applied to the first emission layer EML1 and the second emission layer EML2 so that the light generated from the first emission layer EML1 and the second emission layer EML2 may be effectively emitted to outside of the panel. When light is repeatedly reflected between the anode AD including the reflective layer RFL and the cathode CD which is the semi-transmissive layer, light of a specific wavelength corresponding to a reflection distance may be amplified, light of other wavelengths may be canceled, the amplified light may be emitted to outside of the panel through the cathode CD which is the semi-transmissive layer.

The emission auxiliary layer R' may include a hole transport material, and the emission auxiliary layer R' may be formed of the same material as the hole transport regions HTR1 and HTR2. For example, the emission auxiliary layer R' may include one or more among hole transport materials selected from a group consisting of NPD (N, N-dinaphthyl-N, N'-diphenyl benzidine), TPD (N,N'-bis-(3-methylphenyl)-N, N'-bis(phenyl)-benzidine), s-TAD, and MTDATA (4, 4', 4"-Tris(N-3-methylphenyl-Nphenyl-amino)-triphenylamine). The emission auxiliary layer R' may serve to transport a hole to the red emission layer R and serve to adjust a thickness of the second emission structure unit EU2 (that is, the second hole transport region HTR2, the emission auxiliary layer R', the red emission layer R, and the second electron transport region ETR2).

According to an embodiment, the emission auxiliary layer R' may be formed only in the eleventh pixel PX11. That is, the eleventh pixel PX11 may include the emission auxiliary layer R' and the red emission layer R sequentially stacked in the second emission layer EML2, the twelfth pixel PX12 may include only the green emission layer G in the second emission layer EML2, and the thirteenth pixel PX13 may include only the blue emission layer B in the second emission layer EML2.

As shown in FIG. 11, the eleventh pixel PX11 may be designed to cause second resonance is generated between the reflective layer RFL of the anode AD and the cathode CD by including a structure in which the emission auxiliary layer R' and the red emission layer R are sequentially stacked in the second emission layer EML2, and each of the twelfth pixel PX12 and the thirteenth pixel PX13 may be designed to cause first resonance is generated between the reflective layer RFL of the anode AD and the cathode CD by including only the green emission layer G and the blue emission layer B in the second emission layer EML2. At this time, transmittance of the light emitted from the emission layers EML1 and EML2 varies according to a distance t between the reflective layer RFL of the anode AD and the cathode CD, the light transmittance may be increased as the distance t is decreased. That is, the light transmittance at the time of the first resonance may be greater than the light transmittance at the time of the second resonance. In FIG. 11, the thickness of the second emission layer EML2 is the same for convenience of description, but as described above, the hole transport regions HTR1 and HTR2, the electron transport regions ETR1 and ETR2, the connection layer CGL, and the cathode CD are stacked commonly with respect to the eleventh pixel PX11, the twelfth pixel PX12, and the thirteenth pixel PX13, and thus it should be understood that the thickness of the second emission layer EML2 is decreased in an order of the eleventh pixel PX11, the twelfth pixel PX12, and the thirteenth pixel PX13.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A pixel of a display device, the pixel comprising:
- a light emitting element;
- a first transistor coupled between a first power source line and a first node and having a gate electrode connected to a second node;
- a first capacitor including one electrode connected to the second node and another electrode connected to a third node;
- a second transistor coupled between the third node and a data line;
- a third transistor coupled between the second node and the first node;
- a fourth transistor coupled between a second power source line and the third node;
- an fifth transistor coupled between a fourth node and a third power source line; and
- a sixth transistor coupled between a fifth node and a fourth power source line,
- wherein one frame period includes a display scan period and at least one self-scan period, and
- wherein during a first period of the display scan period, the sixth transistor is turned on, and a first voltage is supplied to the fifth node through the fourth power source line.

2. The pixel according to claim 1, further comprising:
- a seventh transistor coupled between the second node and a fifth power source line,
- wherein during a second period of the display scan period, the seventh transistor is turned on so that a second voltage is supplied to the second node through the fifth power source line, and the fourth transistor is turned on so that a third voltage is supplied to the third node through the second power source line.

3. The pixel according to claim 2, further comprising:
- an eighth transistor coupled between the first power source line and the fifth node connected to one electrode of the first transistor; and
- a ninth transistor coupled between the first node and the fourth node,
- wherein during a third period of the display scan period, the eighth transistor is turned on so that a fourth voltage is supplied to the fifth node through the first power source line.

4. The pixel according to claim 3, wherein at least one of the first to ninth transistors includes an oxide semiconductor.

5. The pixel according to claim 3, wherein during the third period of the display scan period, the third transistor is maintained in a turned-on state, thereby configuring the first transistor in a diode connected shape.

6. The pixel according to claim 5, wherein during a fourth period of the display scan period, the second transistor is turned on, so that a data signal is supplied to the third node through the data line.

7. The pixel according to claim 6, wherein during a fifth period of the display scan period, the eighth transistor and the ninth transistor are turned on, whereby the light emitting element emits light corresponding to the data signal.

8. The pixel according to claim 7, wherein the second to fourth and first periods are sequentially performed during the display scan period.

9. The pixel according to claim 3, wherein during a first period of the self-scan period, the eighth transistor is turned on so that the fourth voltage is supplied to the fifth node through the first power source line.

10. The pixel according to claim 8, wherein during a second period of the self-scan period, the sixth transistor is turned on, and the first voltage is supplied to the fifth node through the fourth power source line.

11. The pixel according to claim 3, wherein as a driving frequency decreases, a number of self-scan periods following the display scan period increases within one frame period.

12. The pixel according to claim 3, further comprising:
- a second capacitor including one electrode connected to the first power source line and another electrode connected to the third node.

13. The pixel according to claim 12, wherein the first power source line and one electrode of the eighth transistor are connected by a bridge pattern.

14. The pixel according to claim 13, wherein the pixel further comprises:
- a (2_1)-th capacitor including one electrode connected to the bridge pattern and another electrode connected to the other electrode of the first capacitor.

15. The pixel according to claim 14, wherein the second power source line and one electrode of the fourth transistor are connected by a first contact hole.

16. The pixel according to claim 15, wherein the third power source line and one electrode of the fifth transistor are connected by a second contact hole.

17. The pixel according to claim 16, wherein the fifth power source line and one electrode of the seventh transistor are connected by a third contact hole.

18. The pixel according to claim 17, wherein the fourth power source line and one electrode of the sixth transistor are connected by a fourth contact hole.

19. The pixel according to claim 1, wherein
- the second transistor includes a (2_1)-th transistor and a (2_2)-th transistor connected in series, and includes a first shielding pattern overlapping a node between the (2_1)-th transistor and the (2_2)-th transistor, and
- the first shielding pattern is connected to the third power source line.

20. The pixel according to claim 1, wherein
- the third transistor includes a (3_1)-th transistor and a (3_2)-th transistor connected in series, and includes a second shielding pattern overlapping a node between the (3_1)-th transistor and the (3_2)-th transistor, and
- the second shielding pattern is connected to the first power source line.

* * * * *